United States Patent
Roy et al.

(10) Patent No.: US 11,994,797 B2
(45) Date of Patent: May 28, 2024

(54) SYSTEM AND METHOD FOR SHAPING A FILM WITH A SCALED CALIBRATION MEASUREMENT PARAMETER

(71) Applicant: CANON KABUSHIKI KAISHA, Tokyo (JP)

(72) Inventors: Nilabh K. Roy, Austin, TX (US); Mario Johannes Meissl, Austin, TX (US); Xiaoming Lu, Cedar Park, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 168 days.

(21) Appl. No.: 17/082,420

(22) Filed: Oct. 28, 2020

(65) Prior Publication Data
US 2022/0128901 A1    Apr. 28, 2022

(51) Int. Cl.
*G03F 7/00*    (2006.01)
*G05B 19/4099*    (2006.01)

(52) U.S. Cl.
CPC ....... *G03F 7/0002* (2013.01); *G05B 19/4099* (2013.01); *G05B 2219/45028* (2013.01)

(58) Field of Classification Search
CPC .................................................... G03F 7/0002
See application file for complete search history.

(56) References Cited

U.S. PATENT DOCUMENTS

| | | |
|---|---|---|
| 6,936,194 B2 | 8/2005 | Watts |
| 7,157,036 B2 | 1/2007 | Choi et al. |
| 8,066,930 B2 | 11/2011 | Sreenivasan et al. |
| 8,076,386 B2 | 12/2011 | Xu et al. |
| 8,140,288 B2 | 3/2012 | Yang et al. |
| 8,349,241 B2 | 1/2013 | Sreenivasan et al. |
| 8,404,169 B2 | 3/2013 | Kawakami et al. |
| 8,562,323 B2 | 10/2013 | Ito et al. |

(Continued)

OTHER PUBLICATIONS

A blog of medium.com, "Statistics—Moments of a distribution" by Singhal, at https://medium.com/analytics-vidhya/statistics-moments-of-a-distribution-1bcfc4cbbd48, available in public on Jun. 6, 2020. (Year: 2020).*

(Continued)

*Primary Examiner* — Timothy Kennedy
*Assistant Examiner* — Inja Song
(74) *Attorney, Agent, or Firm* — Daniel Ratoff

(57) ABSTRACT

A system and method of shaping a film with a template on a substrate. Generating a first series of parameters from tests performed on a first series of films formed with: a set of shaping conditions; a calibration measurement parameter determined for each substrate prior to shaping; and a first scaling parameter. Generating a second series of parameters from the tests performed on a second series of films produced formed with the set of shaping conditions. The second series of films produced with the calibration measurement parameter determined for each substrate; and a second scaling parameter; or without the calibration measurement parameter. Generating a scaling parameter from: the first series of the parameters; and the second series of parameters. Generating the calibration measurement parameter prior to forming the film. Forming the film using the set of shaping conditions, the calibration measurement parameter, and the scaling parameter.

17 Claims, 14 Drawing Sheets

(56) References Cited

U.S. PATENT DOCUMENTS

| | | | |
|---|---|---|---|
| 8,945,444 B2 | 2/2015 | Lu et al. | |
| 9,090,014 B2 | 7/2015 | Lu et al. | |
| 10,241,424 B2 | 3/2019 | Asano et al. | |
| 10,534,259 B2 | 1/2020 | Choi et al. | |
| 2005/0270516 A1 | 12/2005 | Cherala et al. | |
| 2010/0096764 A1 | 4/2010 | Lu | |
| 2011/0074064 A1 | 3/2011 | Hayashi | |
| 2014/0346700 A1* | 11/2014 | Sato | G03F 9/7088 425/169 |
| 2016/0223919 A1* | 8/2016 | Nakagawa | G03F 9/7042 |
| 2017/0008219 A1 | 1/2017 | Asano | |
| 2017/0050351 A1* | 2/2017 | Mizuta | G03F 7/0002 |
| 2019/0033708 A1 | 1/2019 | Cherala et al. | |
| 2019/0033709 A1* | 1/2019 | Cherala | G03F 9/7042 |
| 2019/0101823 A1 | 4/2019 | Patel et al. | |
| 2019/0196324 A1* | 6/2019 | Bamesberger | G03F 7/0002 |

OTHER PUBLICATIONS

Anshuman Cherala, Se-Hyuk Im, Mano Meissl, Ahmed Hussein, Logan Simpson, Ryan Minter, Ecron Thompson, Jin Choi, Mitsuru Hiura, Satoshi Iino, Topography and Flatness Induced Overlay Distortion Correction using Resist Drop Pattern Compensation in Nanoimprint Lithography Systems, Novel Patterning Technologies for Semiconductors, SPIE Advanced Lithography, Feb. 24-28, 2019, Novel Patterning Technologies for Semiconductors, MEMS/NEMS, and MOEMS 2019, 109580C (may 16, 2019); https://doi.org/10.1117/12.2515146.

Nilabh K. Roy, Mario Johannes Meissl, U.S. Appl. No. 16/834,386, filed Mar. 30, 2020.

* cited by examiner

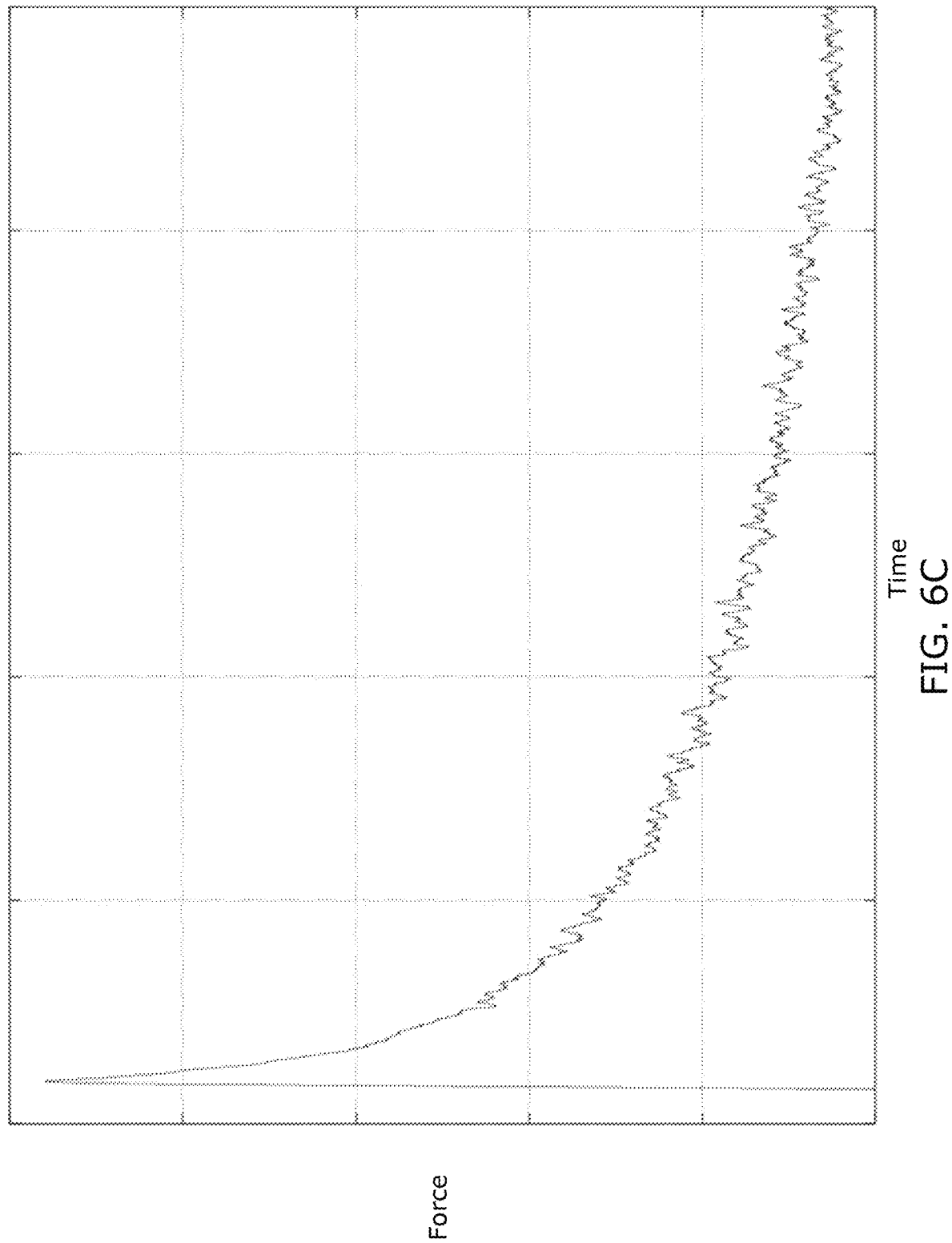

SYSTEM AND METHOD FOR SHAPING A FILM WITH A SCALED CALIBRATION MEASUREMENT PARAMETER

BACKGROUND OF INVENTION

Technical Field

The present disclosure relates to systems and methods for shaping a film. In which calibration measurement parameters are determined and scaling parameters for that calibration measurement parameter are also determined.

Description of the Related Art

Nano-fabrication includes the fabrication of very small structures that have features on the order of 100 nanometers or smaller. One application in which nano-fabrication has had a sizeable impact is in the fabrication of integrated circuits. The semiconductor processing industry continues to strive for larger production yields while increasing the circuits per unit area formed on a substrate. Improvements in nano-fabrication include providing greater process control and/or improving throughput while also allowing continued reduction of the minimum feature dimensions of the structures formed.

One nano-fabrication technique in use today is commonly referred to as nanoimprint lithography. Nanoimprint lithography is useful in a variety of applications including, for example, fabricating one or more layers of integrated devices by shaping a film on a substrate. Examples of an integrated device include but are not limited to CMOS logic, microprocessors, NAND Flash memory, NOR Flash memory, DRAM memory, MRAM, 3D cross-point memory, Re-RAM, Fe-RAM, SU-RAM, MEMS, and the like. Exemplary nanoimprint lithography systems and processes are described in detail in numerous publications, such as U.S. Pat. Nos. 8,349,241, 8,066,930, and 6,936,194, all of which are hereby incorporated by reference herein.

The nanoimprint lithography technique disclosed in each of the aforementioned patents describes the shaping of a film on a substrate by the formation of a relief pattern in a formable material (polymerizable) layer. The shape of this film may then be used to transfer a pattern corresponding to the relief pattern into and/or onto an underlying substrate.

The shaping process uses a template spaced apart from the substrate. The formable liquid is applied onto the substrate. The template is brought into contact with the formable liquid that may have been deposited as a drop pattern causing the formable liquid to spread and fill the space between the template and the substrate. The formable liquid is solidified to form a film that has a shape (pattern) conforming to a shaping surface of the template. After solidification, the template is separated from the solidified layer such that the template and the substrate are spaced apart.

The substrate and the solidified layer may then be subjected to known steps and processes for device (article) fabrication, including, for example, curing, oxidation, layer formation, deposition, doping, planarization, etching, formable material removal, dicing, bonding, and packaging, and the like. For example, the pattern on the solidified layer may be subjected to an etching process that transfers the pattern into the substrate.

SUMMARY OF THE INVENTION

A first embodiment, may be a method of shaping a film with a template on a substrate with a shaping system. The method may comprise generating a first series of deviation parameters from deviation tests performed on a first series of test films on a first series of test substrates produced using the shaping system with: a set of shaping conditions; a calibration measurement parameter of the shaping system determined for each test substrate prior to shaping; and a first test scaling parameter. The method may further comprise generating a second series of deviation parameters from the deviation tests performed on a second series of test films on a second series of test substrates produced using the shaping system with the set of shaping conditions. The second series of test films may be produced with the calibration measurement parameter determined for each test substrate; and a second test scaling parameter; or without the calibration measurement parameter. The method may further comprise generating a scaling parameter from: the first series of the deviation parameters; and the second series of deviation parameters. The method may further comprise generating the calibration measurement parameter of the shaping system, prior to forming a device yielding film on a device yielding substrate. The method may further comprise forming the device yielding film using the set of shaping conditions, the calibration measurement parameter, and the scaling parameter.

In an aspect of the first embodiment, generating the calibration measurement parameter may comprise holding the template at a reference plane above the substrate using one or more actuators. Generating the calibration measurement parameter may further comprise estimating one or more reference forces that each of the one or more actuators use to hold the template at the reference plane for the duration of a reference time. Generating the calibration measurement parameter may further comprise calculating the calibration measurement parameter as a weighted sum of the one or more reference forces.

In an aspect of the first embodiment, estimation of each of the one or more reference forces is based on a current supplied to each of the one or more actuators.

In an aspect of the first embodiment, when the template is at the reference plane, a patterning surface of the template is positioned 50 μm above a surface of the substrate.

In an aspect of the first embodiment, holding the template at the reference plane includes receiving position information from one or more position encoders and sending control information to the one or more actuators based on a feedback loop.

In an aspect of the first embodiment, the reference time is 1 second after the template is within 0.1% of the reference plane.

In an aspect of the first embodiment, forming the test film may comprise depositing formable material on an imprint field of the test substrate. Forming the test film may further comprise contacting the formable material on the imprint field with the template. Forming the test film may further comprise irradiating the formable material with actinic radiation while the template is held in contact with the formable material. The set of shaping conditions may include a desired amount of force to be supplied by one or more actuators to the template while the formable material is irradiated with actinic radiation. Control information which is sent to the one or more actuators to instruct them to supply the desired amount of force may be determined based on the desired amount of force and the calibration measurement parameter.

In an aspect of the first embodiment, the test substrate may include a plurality of imprint fields. The desired amount of force may be different for each imprint field.

In an aspect of the first embodiment, the deviation tests may comprise inspecting a particular test film in the first or second series of test films to determine a set of differences between positions of a first plurality of test features in the particular test film and a second set of test features in an underlying layer underneath the particular test film.

In an aspect of the first embodiment, generating a particular deviation parameter in the first or second series of deviation parameters, may comprise fitting the set of differences for each of the first or second series of test films to a process variation model. The process variation model may determine an estimated set of shaping conditions that were used to shape the particular test film. The particular deviation parameter may be one of the estimated set of shaping conditions.

In an aspect of the first embodiment, the deviation parameter may be an estimation of force that one or more actuators of the shaping system supply to the template that is in contact with formable material on the test substrate while the formable material is being exposed to actinic radiation.

In an aspect of the first embodiment, generating the scaling parameter may include determining a value of the scaling parameter that minimizes a first function. The first function may be based on the first series of the deviation parameters; and the second series of deviation parameters.

In an aspect of the first embodiment, the first function may be a statistical moment that represents a variation of a second function over the first series of the deviation parameters; and the second series of deviation parameters.

In an aspect of the first embodiment, the second function may be:

$$G_i = \frac{1}{M(s_1 - s_2)} \left( \sum_{j=1}^{M} (s_1 D_{2,i,j} - s_2 D_{1,i,j}) + S \left( \sum_{j=1}^{M} D_{1,i,j} - \sum_{j=1}^{M} D_{2,i,j} \right) \right).$$

In which i is a substrate index that represents a temporal positional order of a particular test substrate in each of the first series of test substrates and the second series of test substrates. In which j is a field index of an imprint field on each of the test substrates in each of the first series of test substrates and the second series of test substrates. In which M is the number of imprint fields on each of the test substrates. In which $s_1$ is a first test scaling parameter. In which $s_2$ is a second test scaling parameter. In which $D_{1,i,j}$ is a deviation parameter in the first series of the deviation parameters. In which $D_{2,i,j}$ is a deviation parameter in the second series of the deviation parameters. In which S is the scaling parameter, wherein the scaling parameter is not zero or one.

In an aspect of the first embodiment, the second function may be:

$$G_i = \frac{1}{M(s_1 - s_2)} \left( \sum_{j=1}^{M} (s_1 D_{2,i,j} - s_2 D_{1,i,j}) + S_k \left( \sum_{j=1}^{M} D_{1,i,j} - \sum_{j=1}^{M} D_{2,i,j} \right) \right);$$

In which i is a substrate index that represents a temporal positional order of a particular test substrate in each of the first series of test substrates and the second series of test substrates. In which j is a field index of an imprint field on each of the test substrates in each of the first series of test substrates and the second series of test substrates. In which M is the number of imprint fields on each of the test substrates. In which $s_1$ is a first test scaling parameter. In which $s_2$ is a second test scaling parameter. In which $D_{1,i,j}$ is a deviation parameter in the first series of the deviation parameters. In which $D_{2,i,j}$ is a deviation parameter in the second series of the deviation parameters. In which the scaling parameter is a set of scaling parameters that varies with the substrate index i. In which $S_k$ is a kth scaling parameter in the set of scaling parameters, wherein the scaling parameter is not zero or one.

In an aspect of the first embodiment, generating the scaling parameter may include calculating:

$$S = \frac{1}{N-1} \sum_{i=2}^{N} \frac{s_2 \sum_{j=1}^{M} (D_{1,i,j} - D_{1,1,j}) - s_1 \sum_{j=1}^{M} (D_{2,i,j} - D_{2,1,j})}{\sum_{j=1}^{M} (D_{1,i,j} - D_{1,1,j}) - \sum_{j=1}^{M} (D_{2,i,j} - D_{2,1,j})}.$$

In which i is a substrate index that represents a temporal positional order of a particular test substrate in each of the first series of test substrates and the second series of test substrates. In which N is the number of test substrates in each of the first series of test substrates and the second series of test substrates. In which j is a field index of an imprint field on each of the test substrates in each of the first series of test substrates and the second series of test substrates. In which M is the number of imprint fields on each of the test substrates. In which $s_1$ is a first test scaling parameter. In which $s_2$ is a second test scaling parameter. In which $D_{1,i,j}$ is a deviation parameter in the first series of the deviation parameters. In which $D_{2,i,j}$ is a deviation parameter in the second series of the deviation parameters. In which S is not zero or one.

In an aspect of the first embodiment, the first scaling parameter may be one, and second scaling parameter may be greater than zero and less than one.

In an aspect of the first embodiment, generating the first series of deviation parameters may comprise (a) generating a particular calibration measurement parameter of the shaping system, prior to forming, with the template and the shaping system, a particular test film in the first series of test films on a particular substrate in the first series of test substrates. Generating the first series of deviation parameters may further comprise (b) forming, with the template and the shaping system, the particular test film on the particular test substrate using: the set of shaping conditions, the calibration measurement parameter, and the first test scaling parameter. Generating the first series of deviation parameters may further comprise (c) estimating deviations of the particular test film from an ideal film. Generating the first series of deviation parameters may further comprise (d) generating a particular deviation parameter in the first series of deviation parameters based on the deviations of the particular test film. Generating the first series of deviation parameters may further comprise (e) forming the first series of the deviation parameters by repeating steps (a)-(d) for each particular test substrate in the first series of substrates.

In an aspect of the first embodiment, generating the second series of deviation parameters may comprise (a) forming, with the template and the shaping system, a particular test film in the second series of test films on a particular substrate in the second series of test substrates using the set of shaping conditions. Generating the second series of deviation parameters may further comprise (b) estimating deviations of the particular test film from an ideal film. Generating the second series of deviation parameters may further comprise (c) generating a particular deviation parameter in the second series of deviation parameters based on the deviations of the particular test film. Generating the second series of deviation parameters may further comprise (d) forming the second series of the deviation parameters by repeating steps (a)-(c) for each particular test substrate in the second series of substrates.

An aspect of the first embodiment, a method of manufacturing articles including the method of shaping the film. The method of manufacturing articles may further comprise processing the device yielding substrate on which the device yielding film is produced so as to manufacture the articles.

A second embodiment, may be a system for shaping films on a substrate with a template. The system may comprise a substrate chuck configured to hold the substrate. The system may further comprise a template chuck configured to hold the template. The system may further comprise a dispenser configured to dispense a formable material onto the substrate. The system may further comprise one or more actuators configured to move the template chuck and the substrate chuck relative to each other. The system may further comprise an actinic radiation source. The system may further comprise a memory. The system may further comprise a processor. The processor may be configured to send instructions for generating a first series of deviation parameters from deviation tests performed on a first series of test films on a first series test substrates produced using the shaping system with: a set of shaping conditions; a calibration measurement parameter of the shaping system determined for each test substrate prior to shaping; and a first test scaling parameter. The processor may be further configured to send instructions for generating a second series of deviation parameters from the deviation tests performed on a second series of test films on a second series test substrates produced using the shaping system with the set of shaping conditions. The second series of test films may be produced with the calibration measurement parameter determined for each test substrate; and a second test scaling parameter; or without the calibration measurement parameter. The processor may be further configured to send instructions for generating a scaling parameter from: the first series of the deviation parameters; and the second series of deviation parameters. The processor may be further configured to send instructions for generating the calibration measurement parameter of the shaping system, prior to forming a device yielding film on a device yielding substrate. The processor may be further configured to send instructions for forming the device yielding film using the set of shaping conditions, the calibration measurement parameter, and the scaling parameter.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF THE FIGURES

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention and are therefore not to be considered limiting of its scope, for the invention may admit to other equally effective embodiments.

FIG. 6C is a plot illustrating signals used for estimating forces in an exemplary embodiment.

Figure 1:
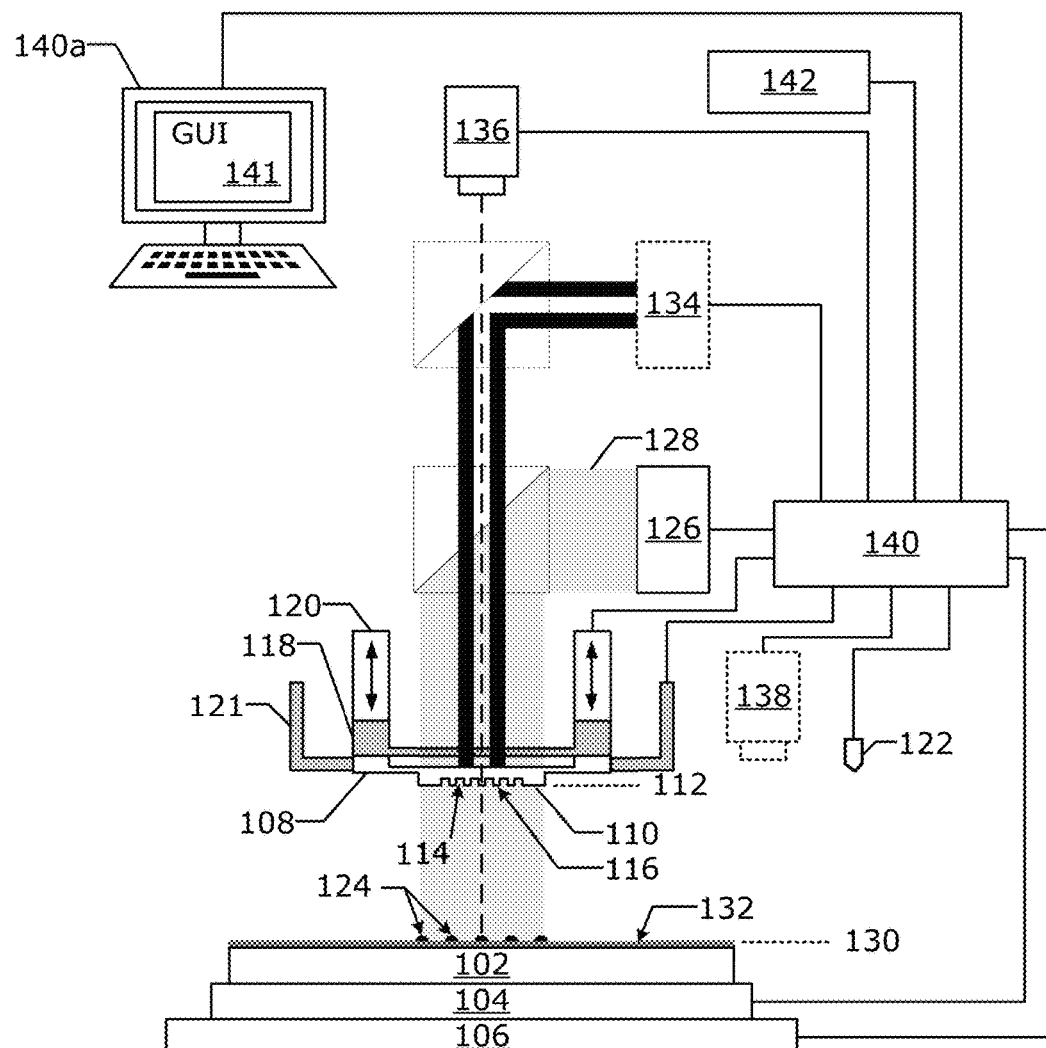
FIG. 1 is an illustration of an exemplary shaping system having a template with a mesa spaced apart from a substrate as used in an embodiment.

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

The nanoimprinting lithography technique can be used to shape a film on a substrate. The shaping process includes bringing a template into contact with formable material which fills a gap between the template and the substrate. After the formable material has filled the gap between the template and the substrate, the formable material may be cured. During the shaping process one or more actuators are used to apply specific controlled forces during different times of the shaping process. The applicant has found that the precision and accuracy of this force impacts the quality of the cured film.

The shaping process may be divided into a plurality of periods including but not limited to: a contacting period; a filling period; a curing period; and a separation period. An important period during which the force is applied is when the formable material is being cured. The applicant has found that the precision and accuracy of the applied force during one or more of these periods has an impact on the quality of the film. For example, the applicant has found that the ability to precisely and accurately apply a desired curing period force during the curing period has a direct impact on measured overlay between the imprinted layer and an underlying layer.

One typical method of controlling a force is to employ a contact-based force sensor to measure the applied force. The applicant has found that force sensors are not practical for imprint lithography. Another method is to calibrate the effort that the one or more actuators supply versus the measured and static positions of the template. The applicant has found that the calibration of the position of the template versus the effort supplied is not sufficient to achieve the overlay tolerances desired. What is needed is improved force control method during the various shaping periods.

Nanoimprint System (Shaping System)

FIG. 1 is an illustration of a shaping system 100 in which an embodiment may be implemented. The shaping system 100 is used to produce an imprinted (shaped) film on a substrate 102. The substrate 102 may be coupled to a substrate chuck 104. The substrate chuck 104 may be but is not limited to a vacuum chuck, pin-type chuck, groove-type chuck, electrostatic chuck, electromagnetic chuck, and/or the like.

The substrate 102 and the substrate chuck 104 may be further supported by a substrate positioning stage 106. The substrate positioning stage 106 may provide translational and/or rotational motion along one or more of the x, y, z, θ, ψ, and φ-axes. The substrate positioning stage 106, the substrate 102, and the substrate chuck 104 may also be positioned on a base (not shown). The substrate positioning stage may be a part of a positioning system. In an alternative embodiment, the substrate chuck 104 may be attached to the base.

Spaced-apart from the substrate 102 is a template 108. The template 108 may include a body having a mesa (also referred to as a mold) 110 extending towards the substrate 102 on a front side of the template 108. The mesa 110 may have a shaping surface 112 thereon also on the front side of the template 108. The shaping surface 112, also known as a patterning surface, is the surface of the template that shapes the formable material 124. In an embodiment, the shaping surface 112 is planar and is used to planarize the formable material. Alternatively, the template 108 may be formed without the mesa 110, in which case the surface of the template facing the substrate 102 is equivalent to the mold 110 and the shaping surface 112 is that surface of the template 108 facing the substrate 102.

The template 108 may be formed from such materials including, but not limited to, fused-silica, quartz, silicon, organic polymers, siloxane polymers, borosilicate glass, fluorocarbon polymers, metal, hardened sapphire, and/or the like. The shaping surface 112 may have features defined by a plurality of spaced-apart template recesses 114 and/or template protrusions 116. The shaping surface 112 defines a pattern that forms the basis of a pattern to be formed on the substrate 102. In an alternative embodiment, the shaping surface 112 is featureless in which case a planar surface is formed on the substrate. In an alternative embodiment, the shaping surface 112 is featureless and the same size as the substrate and a planar surface is formed across the entire substrate.

Template 108 may be coupled to a template chuck 118. The template chuck 118 may be, but is not limited to, vacuum chuck, pin-type chuck, groove-type chuck, electrostatic chuck, electromagnetic chuck, and/or other similar chuck types. The template chuck 118 may be configured to apply stress, pressure, and/or strain to template 108 that varies across the template 108. The template chuck 118 may include piezoelectric actuators which can squeeze and/or stretch different portions of the template 108. The template chuck 118 may include a system such as a zone based vacuum chuck, an actuator array, a pressure bladder, etc. which can apply a pressure differential to a back surface of the template causing the template to bend and deform.

The template chuck 118 may be coupled to an imprint head 120 which is a part of the positioning system. The imprint head 120 may be moveably coupled to a bridge. The imprint head 120 may include one or more actuators such as voice coil motors, piezoelectric motors, linear motor, nut and screw motor, etc., which are configured to move the template chuck 118 relative to the substrate in at least the z-axis direction, and potentially other directions (e.g. x, y, θ, ψ, and φ-axes).

The shaping system 100 may further comprise a fluid dispenser 122. The fluid dispenser 122 may also be moveably coupled to the bridge. In an embodiment, the fluid dispenser 122 and the imprint head 120 share one or more or all of the positioning components. In an alternative embodiment, the fluid dispenser 122 and the imprint head 120 move independently from each other. The fluid dispenser 122 may be used to deposit liquid formable material 124 (e.g., polymerizable material) onto the substrate 102 in a drop pattern. Additional formable material 124 may also be added to the substrate 102 using techniques, such as, drop dispense, spin-coating, dip coating, chemical vapor deposition (CVD), physical vapor deposition (PVD), thin film deposition, thick film deposition, and/or the like prior to the formable material 124 being deposited onto the substrate 102. The formable material 124 may be dispensed upon the substrate 102 before and/or after a desired volume is defined between the shaping surface 112 and the substrate 102 depending on design considerations. The formable material 124 may comprise a mixture including a monomer as described in U.S. Pat. Nos. 7,157,036 and 8,076,386, both of which are herein incorporated by reference.

Different fluid dispensers 122 may use different technologies to dispense formable material 124. When the formable material 124 is jettable, ink jet type dispensers may be used to dispense the formable material. For example, thermal ink jetting, microelectromechanical systems (MEMS) based ink jetting, valve jet, and piezoelectric ink jetting are common techniques for dispensing jettable liquids.

The shaping system 100 may further comprise a curing system that induces a phase change in the liquid formable material into a solid material whose top surface is determined by the shape of the shaping surface 112. The curing system may include at least a radiation source 126 that directs actinic energy along an exposure path 128. The imprint head 120 and the substrate positioning stage 106 may be configured to position the template 108 and the substrate 102 in superimposition with the exposure path 128. The radiation source 126 sends the actinic energy along the exposure path 128 after the template 108 has contacted the formable material 128. FIG. 1 illustrates the exposure path 128 when the template 108 is not in contact with the formable material 124, this is done for illustrative purposes so that the relative position of the individual components can be easily identified. An individual skilled in the art would understand that exposure path 128 would not substantially change when the template 108 is brought into contact with the formable material 124. In an embodiment, the actinic energy may be directed through both the template chuck 118 and the template 108 into the formable material 124 under the template 108. In an embodiment, the actinic energy produced by the radiation source 126 is UV light that induces polymerization of monomers in the formable material 124.

The shaping system 100 may further comprise a field camera 136 that is positioned to view the spread of formable material 124 after the template 108 has made contact with the formable material 124. FIG. 1 illustrates an optical axis of the field camera's imaging field as a dashed line. As illustrated in FIG. 1 the shaping system 100 may include one or more optical components (dichroic mirrors, beam combiners, prisms, lenses, mirrors, etc.) which combine the actinic radiation with light to be detected by the field camera. The field camera 136 may be configured to detect the spread of formable material under the template 108. The optical axis of the field camera 136 as illustrated in FIG. 1 is straight but may be bent by one or more optical components. The field camera 136 may include one or more of: a CCD; a sensor array; a line camera; and a photodetector which are configured to gather light that has a wavelength that shows a contrast between regions underneath the template 108 that are in contact with the formable material, and regions underneath the template 108 which are not in contact with the formable material 124. The field camera 136 may be configured to gather monochromatic images of visible light. The field camera 136 may be configured to provide images of the spread of formable material 124 underneath the template 108; the separation of the template 108 from cured formable material; and can be used to keep track of the imprinting (shaping) process. The field camera 136 may also be configured to measure interference fringes, which change as the formable material spreads 124 between the gap between the shaping surface 112 and the substrate surface 130.

The shaping system 100 may further comprise a droplet inspection system 138 that is separate from the field camera 136. The droplet inspection system 138 may include one or more of a CCD, a camera, a line camera, and a photodetector. The droplet inspection system 138 may include one or more optical components such as lenses, mirrors, apertures, filters, prisms, polarizers, windows, adaptive optics, and/or light sources. The droplet inspection system 138 may be positioned to inspect droplets prior to the shaping surface 112 contacting the formable material 124 on the substrate 102. In an alternative embodiment, the field camera 136 may be configured as a droplet inspection system 138 and used prior to the shaping surface 112 contacting the formable material 124

The shaping system 100 may further include a thermal radiation source 134 which may be configured to provide a spatial distribution of thermal radiation to one or both of the template 108 and the substrate 102. The thermal radiation source 134 may include one or more sources of thermal electromagnetic radiation that will heat up one or both of the substrate 102 and the template 108 and does not cause the formable material 124 to solidify. The thermal radiation source 134 may include a spatial light modulator such as a digital micromirror device (DMD), Liquid Crystal on Silicon (LCoS), Liquid Crystal Device (LCD), etc., to modulate the spatio-temporal distribution of thermal radiation. The shaping system 100 may further comprise one or more optical components which are used to combine the actinic radiation, the thermal radiation, and the radiation gathered by the field camera 136 onto a single optical path that intersects with the imprint field when the template 108 comes into contact with the formable material 124 on the substrate 102. The thermal radiation source 134 may send the thermal radiation along a thermal radiation path (which in FIG. 1 is illustrated as 2 thick dark lines) after the template 108 has contacted the formable material 128. FIG. 1 illustrates the thermal radiation path when the template 108 is not in contact with the formable material 124, this is done for illustrative purposes so that the relative position of the individual components can be easily identified. An individual skilled in the art would understand that the thermal radiation path would not substantially change when the template 108 is brought into contact with the formable material 124. In FIG. 1 the thermal radiation path is shown terminating at the template 108, but it may also terminate at the substrate 102. In an alternative embodiment, the thermal radiation source 134 is underneath the substrate 102, and thermal radiation path is not combined with the actinic radiation and the visible light.

Prior to the formable material 124 being dispensed onto the substrate, a substrate coating 132 may be applied to the substrate 102. In an embodiment, the substrate coating 132 may be an adhesion layer. In an embodiment, the substrate coating 132 may be applied to the substrate 102 prior to the substrate being loaded onto the substrate chuck 104. In an alternative embodiment, the substrate coating 132 may be applied to substrate 102 while the substrate 102 is on the substrate chuck 104. In an embodiment, the substrate coating 132 may be applied by spin coating, dip coating, drop dispense, slot dispense, etc. In an embodiment, the substrate 102 may be a semiconductor wafer. In another embodiment, the substrate 102 may be a blank template (replica blank) that may be used to create a daughter template after being imprinted.

The shaping system 100 may include an imprint field atmosphere control system such as gas and/or vacuum system, an example of which is described in U.S. Patent Publication Nos. 2010/0096764 and 2019/0101823 which are hereby incorporated by reference. The gas and/or vacuum system may include one or more of pumps, valves, solenoids, gas sources, gas tubing, etc. which are configured to cause one or more different gases to flow at different times and different regions. The gas and/or vacuum system may be connected to a first gas transport system that transports gas to and from the edge of the substrate 102 and controls the imprint field atmosphere by controlling the flow of gas at the edge of the substrate 102. The gas and/or vacuum system may be connected to a second gas transport system that transports gas to and from the edge of the template 108 and controls the imprint field atmosphere by controlling the flow of gas at the edge of the template 108. The gas and/or vacuum system may be connected to a third gas transport system that transports gas to and from the top of the template 108 and controls the imprint field atmosphere by controlling the flow of gas through the template 108. One or more of the first, second, and third gas transport systems may be used in combination or separately to control the flow of gas in and around the imprint field.

The shaping system 100 may be regulated, controlled, and/or directed by one or more processors 140 (controller) in communication with one or more components and/or subsystems such as the substrate chuck 104, the substrate positioning stage 106, the template chuck 118, the imprint head 120, the fluid dispenser 122, the radiation source 126, the thermal radiation source 134, the field camera 136, imprint field atmosphere control system, and/or the droplet inspection system 138. The processor 140 may operate based on instructions in a computer readable program stored in a non-transitory computer readable memory 142. The processor 140 may be or include one or more of a CPU, MPU, GPU, ASIC, FPGA, DSP, and a general-purpose computer. The processor 140 may be a purpose-built controller or may be a general-purpose computing device that is adapted to be a controller. Examples of a non-transitory computer readable memory include but are not limited to RAM, ROM, CD, DVD, Blu-Ray, hard drive, networked attached storage (NAS), an intranet connected non-transitory computer readable storage device, and an internet connected non-transitory computer readable storage device. The controller 140 may include a plurality of processors that are both included in the shaping system 100a and in communication with the shaping system 100a. The processor 140 may be in communication with a networked computer 140a on which analysis is performed and control files such as a drop pattern are generated. In an embodiment, there are one or more graphical user interface (GUI) 141 on one or both of the networked computer 140a and a display in communication with the processor 140 which are presented to an operator and/or user.

Either the imprint head 120, the substrate positioning stage 106, or both varies a distance between the mold 110 and the substrate 102 to define a desired space (a bounded physical extent in three dimensions) that is filled with the formable material 124. For example, the imprint head 120 may apply a force to the template 108 such that mold 110 is in contact with the formable material 124. After the desired volume is filled with the formable material 124, the radiation source 126 produces actinic radiation (e.g. UV, 248 nm, 280 nm, 350 nm, 365 nm, 395 nm, 400 nm, 405 nm, 435 nm, etc.) causing formable material 124 to cure, solidify, and/or cross-link; conforming to a shape of the substrate surface 130 and the shaping surface 112, defining a patterned layer on the substrate 102. The formable material 124 is cured while the template 108 is in contact with formable material 124, forming the patterned layer on the substrate 102. Thus, the shaping system 100 uses a shaping process to form the patterned layer which has recesses and protrusions which are an inverse of the pattern in the shaping surface 112. In an alternative embodiment, the shaping system 100 uses a shaping process to form a planar layer with a featureless shaping surface 112.

The shaping process may be done repeatedly in a plurality of imprint fields (also known as just fields or shots) that are spread across the substrate surface 130. Each of the imprint fields may be the same size as the mesa 110 or just the pattern area of the mesa 110. The pattern area of the mesa 110 is a region of the shaping surface 112 which is used to imprint patterns on a substrate 102 which are features of the device or are then used in subsequent processes to form features of the device. The pattern area of the mesa 110 may or may not include mass velocity variation features (fluid control features) which are used to prevent extrusions from forming on imprint field edges. In an alternative embodiment, the substrate 102 has only one imprint field which is the same size as the substrate 102 or the area of the substrate 102 which is to be patterned with the mesa 110. In an alternative embodiment, the imprint fields overlap. Some of the imprint fields may be partial imprint fields which intersect with a boundary of the substrate 102.

The patterned layer may be formed such that it has a residual layer having residual layer thickness (RLT) that is a minimum thickness of formable material 124 between the substrate surface 130 and the shaping surface 112 in each imprint field. The patterned layer may also include one or more features such as protrusions which extend above the residual layer having a thickness. These protrusions match the recesses 114 in the mesa 110.

Template

Figure 2:
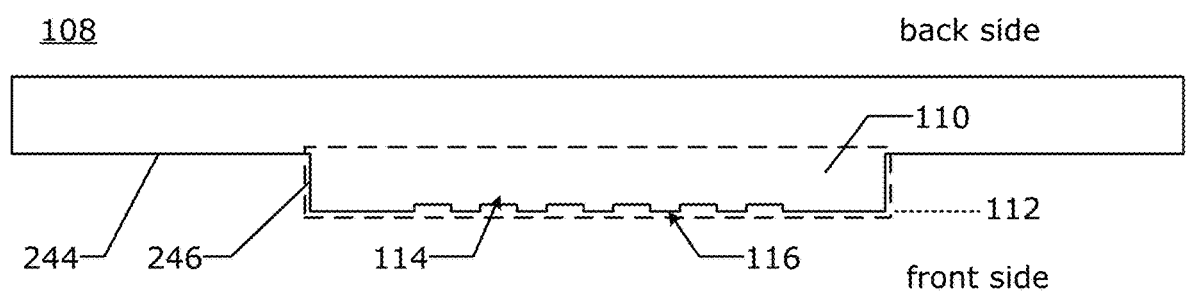
FIG. 2 is an illustration of an exemplary template that may be used in an embodiment.

FIG. 2 is an illustration of a template 108 (not to scale) that may be used in an embodiment. The shaping surface 112 may be on a mesa 110 (identified by the dashed box in FIG. 2). The mesa 110 is surrounded by a recessed surface 244 on the front side of the template. Mesa sidewalls 246 connect the recessed surface 244 to shaping surface 112 of the mesa 110. The mesa sidewalls 246 surround the mesa 110. In an embodiment in which the mesa is round or has rounded corners, the mesa sidewalls 246 refers to a single mesa sidewall that is a continuous wall without corners.

Shaping Process

Figure 3:
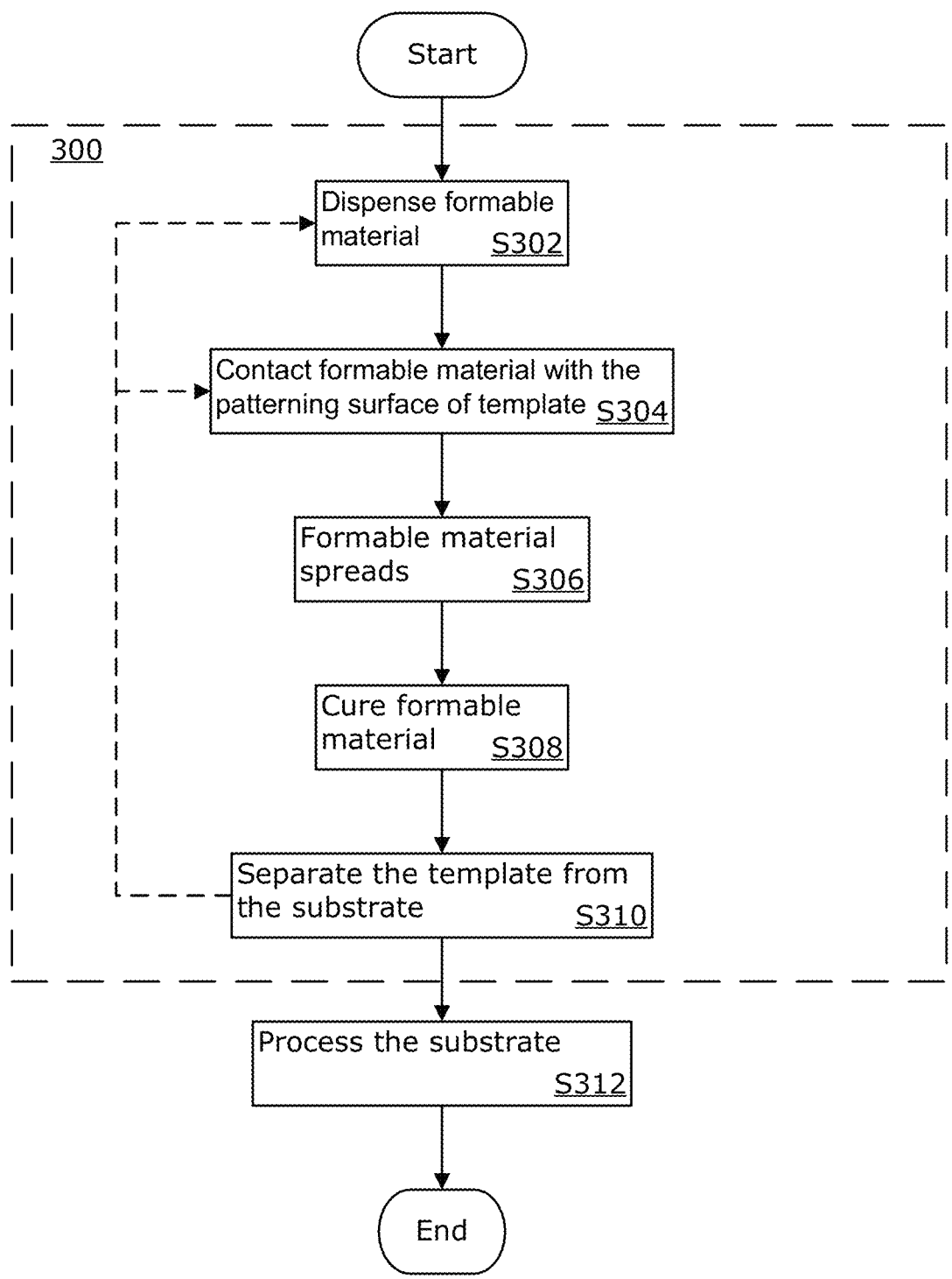
FIG. 3 is a flowchart illustrating an exemplary shaping process as used in an embodiment.

FIG. 3 is a flowchart of a method of manufacturing an article (device) that includes a shaping process 300 by the shaping system 100 that can be used to form patterns in formable material 124 on one or more imprint fields (also referred to as: pattern areas or shot areas). The shaping process 300 may be performed repeatedly on a plurality of substrates 102 by the shaping system 100. The processor 140 may be used to control the shaping process 300.

In an alternative embodiment, the shaping process 300 is used to planarize the substrate 102. In which case, the shaping surface 112 is featureless and may also be the same size or larger than the substrate 102.

The beginning of the shaping process 300 may include a template mounting step causing a template conveyance mechanism to mount a template 108 onto the template chuck 118. The shaping process may also include a substrate mounting step, the processor 140 may cause a substrate conveyance mechanism to mount the substrate 102 onto the substrate chuck 104. The substrate may have one or more coatings and/or structures. The order in which the template 108 and the substrate 102 are mounted onto the shaping system 100 is not particularly limited, and the template 108 and the substrate 102 may be mounted sequentially or simultaneously.

In a positioning step, the processor 140 may cause one or both of the substrate positioning stage 106 and/or a dispenser positioning stage to move an imprinting field (identified by an imprinting field index, which may be initially set to 1) of the substrate 102 to a fluid dispense position below the fluid dispenser 122. The substrate 102, may be divided into a number of imprinting fields, wherein each imprinting field is identified by an imprinting field index. In which the number of imprinting fields is a real positive integer such as 1, 10, 62, 75, 84, 100, etc. In a dispensing step S302, the processor 140 may cause the fluid dispenser 122 to dispense formable material based on a drop pattern onto an imprinting field. In an embodiment, the fluid dispenser 122 dispenses the formable material 124 as a plurality of droplets. The fluid dispenser 122 may include one nozzle or multiple nozzles. The fluid dispenser 122 may eject formable material 124 from the one or more nozzles simultaneously. The imprint field may be moved relative to the fluid dispenser 122 while the fluid dispenser is ejecting formable material 124. Thus, the time at which some of the droplets land on the substrate may vary across the imprint field.

In an embodiment, during the dispensing step S302, the formable material 124 is dispensed onto the substrate 102 in accordance with a drop pattern. The drop pattern may include information such as one or more of position to deposit drops of formable material, the volume of the drops of formable material, type of formable material, shape parameters of the drops of formable material, etc. In an embodiment, the drop pattern may include only the volumes of the drops to be dispensed and the location of where to deposit the droplets.

After, the droplets are dispensed, then a contacting step S304 may be initiated, the processor 140 may cause one or both of the substrate positioning stage 106 and a template positioning stage to bring the shaping surface 112 of the template 108 into contact with the formable material 124 in imprint field.

During a spreading step S306, the formable material 124 then spreads out towards the edge of the imprint field and the mesa sidewalls 246. The edge of the imprint field may be defined by the mesa sidewalls 246. How the formable material 124 spreads and fills the mesa can be observed via the field camera 136 and may be used to track a progress of a fluid front of formable material.

In a curing step S308, the processor 140 may send instructions to the radiation source 126 to send a curing illumination pattern of actinic radiation through the template 108, the mesa 110, and the shaping surface 112. The curing illumination pattern provides enough energy to cure (polymerize) the formable material 124 under the shaping surface 112.

In a separation step S310, the processor 140 uses one or more of the substrate chuck 104, the substrate positioning stage 106, template chuck 118, and the imprint head 120 to separate the shaping surface 112 of the template 108 from the cured formable material on the substrate 102. If there are additional imprint fields to be imprinted, then the process moves back to step S302. In an alternative embodiment, during step S302 two or more imprint fields receive formable material 124 and the process moves back to steps S302 or S304.

In an embodiment, after the shaping process 300 is finished additional semiconductor manufacturing processing is performed on the substrate 102 in a processing step S312 so as to create an article of manufacture (e.g. semiconductor device). In an embodiment, each imprint field includes a plurality of devices.

The further semiconductor manufacturing processing in processing step S312 may include etching processes to transfer a relief image into the substrate that corresponds to the pattern in the patterned layer or an inverse of that pattern. The further processing in processing step S312 may also include known steps and processes for article fabrication, including, for example, inspection, curing, oxidation, layer formation, deposition, doping, planarization, etching, formable material removal, dicing, bonding, packaging, mounting, circuit board assembly, and the like. The substrate 102 may be processed to produce a plurality of articles (devices).

Template Position and Shape Controller

Figure 4A:
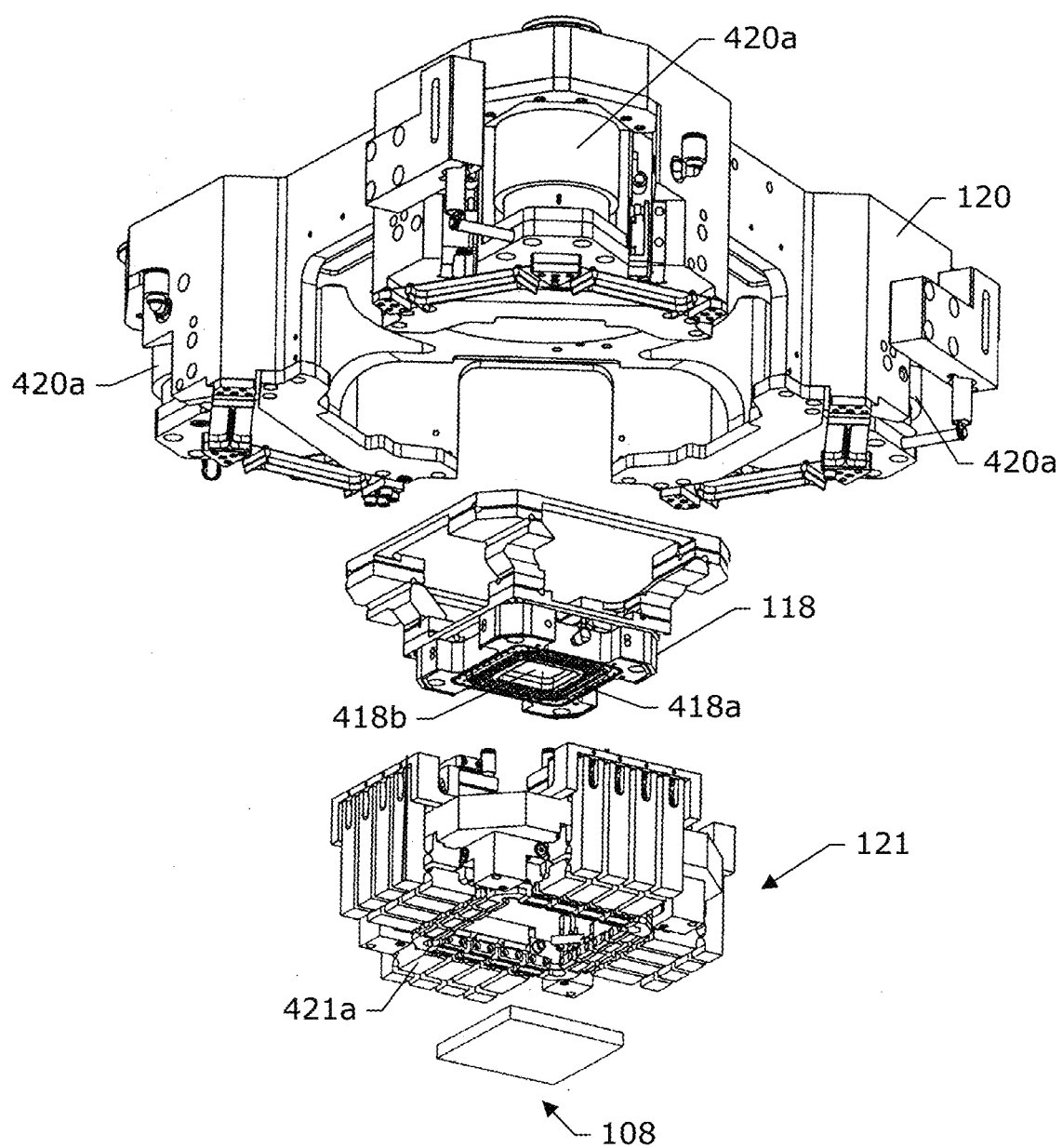
FIG. 4A is an exploded view diagram illustrating components of an exemplary embodiment.

FIG. 4A is an exploded view diagram illustrating components of the shaping system 100 which are used to control the position and shape of the template 108 an example of which is described in US Patent Publication No. 2005/0270516-A1 which is hereby incorporated by reference. In an embodiment, the template 108 is held by the template chuck 118. The template chuck 118 includes one or more edge recesses 418a which are connected to one or more vacuum pumps which can be used to secure the template 108 to the template chuck. The template chuck 118 may also include at least one center recess 418b which is connected to a pump system which can be used to bow the template 108 during steps S304 and S306.

The shaping system 100 may also include a finger sub-assembly 121 which can apply a plurality of compressive stresses to the edge of the template 108. In an alternative embodiment, shaping system 100 may also include an actuator sub-assembly (not shown) which can apply a plurality of compressive and/or tensile stresses to the edge of the template 108. For example, the finger sub-assembly 121 may include a plurality of fingers 421a which apply pressure to the edges of the template 108. Each finger 421a is attached to a finger actuator which supplies an adjustable force that the finger 421a applies to the edge of the template 108. The forces applied by the plurality of fingers 421a work together to change the shape the template 108 during the shaping process 300.

Figure 4B:
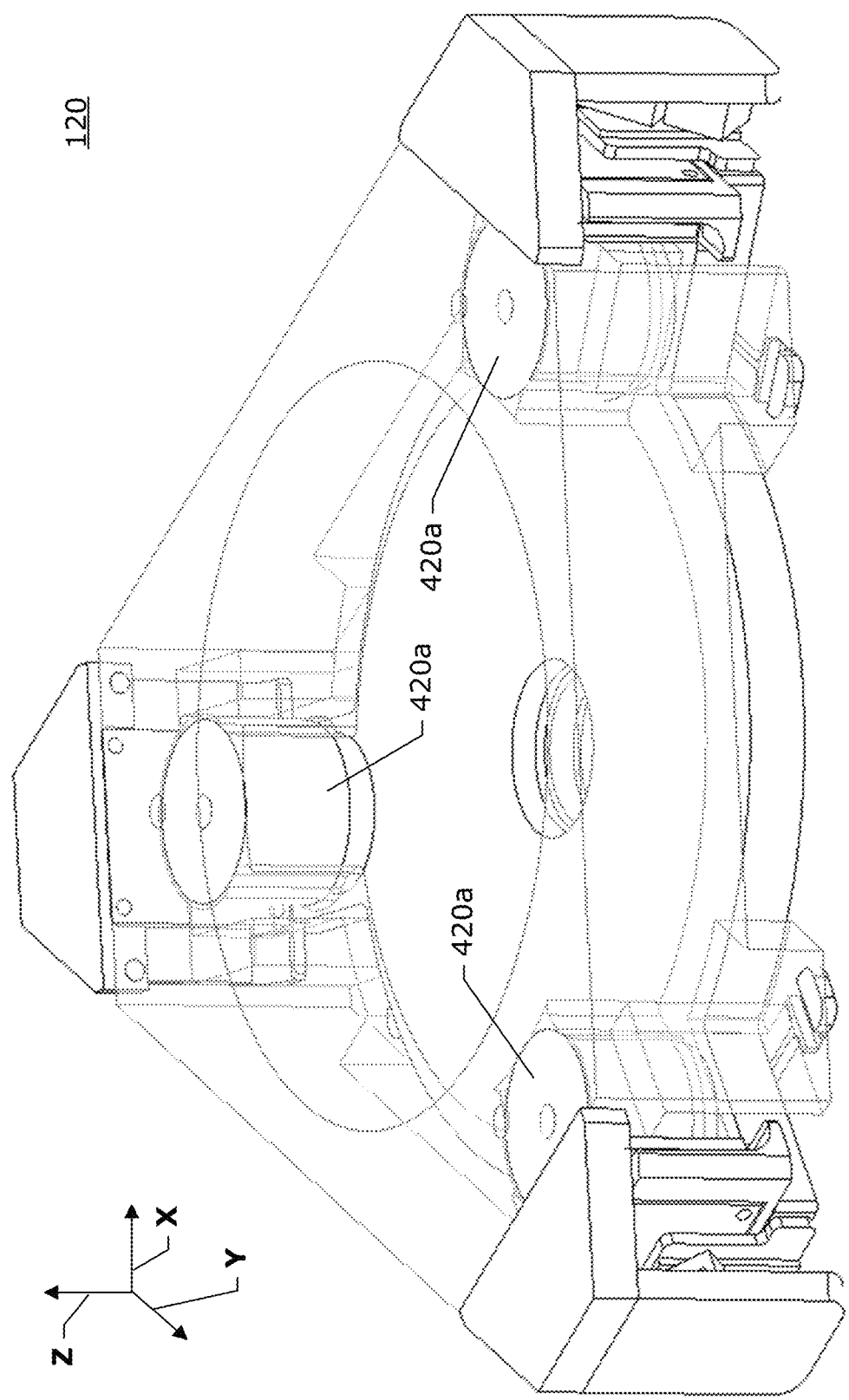
FIG. 4B is a view of some components of an exemplary embodiment.

The shaping system 100 may also include an imprint head 120. FIG. 4B is an illustration of some of the components of the imprint head 120 an example of which is described in US Patent Publication No. 2019-0196324-A1 which is hereby incorporated by reference. The imprint head 120 includes a plurality of imprint force actuators 420a which may be configured to move the template 108 held by the template chuck 118 up and down during the contacting step S308 and supply a specific calibrated force (which may be zero) during the curing step S308.

Imprint Force Calibration

Figure 5A:
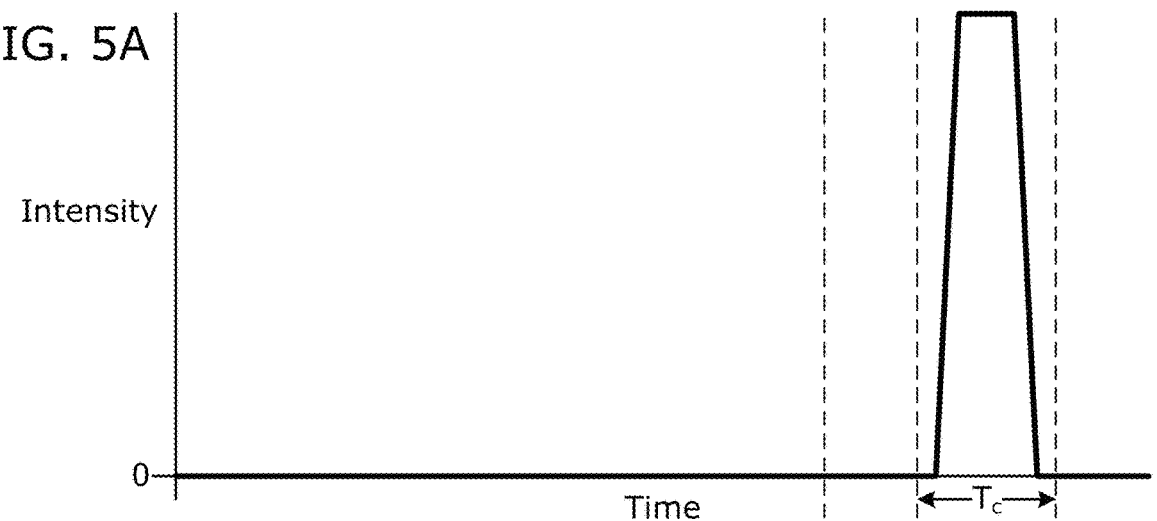
FIGS. 5A-C are timing charts illustrating values of parameters of the shaping system as used in an exemplary embodiment.
Figure 5B:
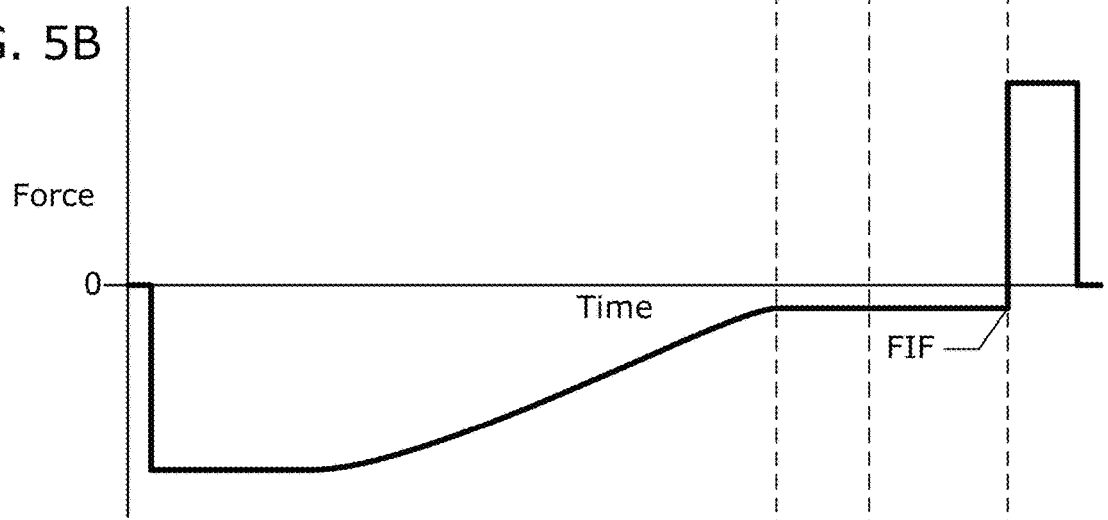
Figure 5C:
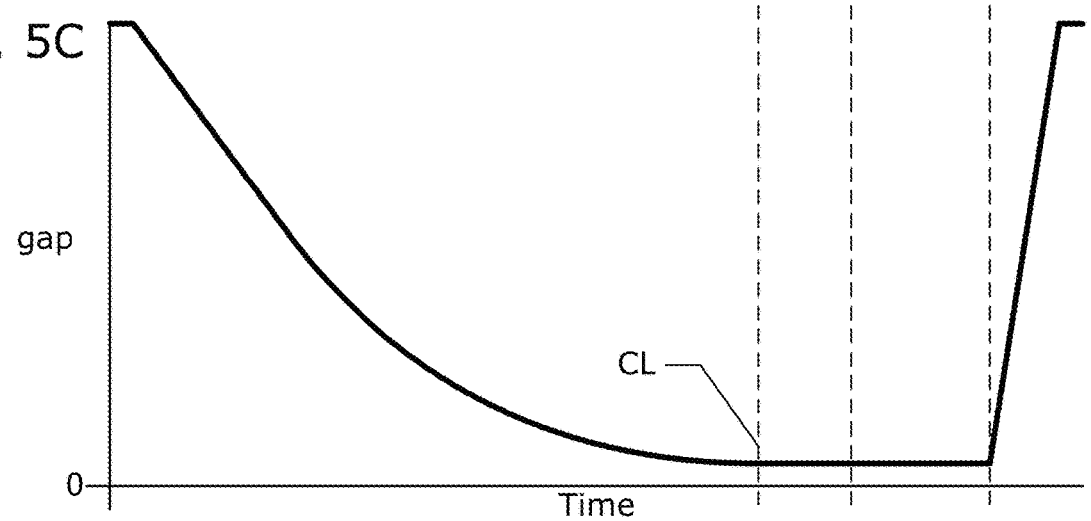

The shaping process 300 is performed using a desired set of shaping conditions. The desired set of shaping conditions may include a final imprint force (FIF). The desired FIF is the desired force that template 108 applies to the formable material 124 at the end of and/or during a curing period $T_c$ as illustrated in FIGS. 5A-C. At the beginning of the shaping process 300 the actuators supply enough force to move the template chuck until at least a portion of template, which may be bowed, is in touch with the formable material on the substrate held by the substrate chuck. At a time CL, if the template is bowed, then the bowing is reduced until the template is substantially parallel with the substrate. In the context of the present application substantially parallel means that at least 90% of the patterning area of the template is parallel with 90% of the area of the substrate that is to be patterned. Substantially parallel may also mean that an angular difference between a substrate plane and a template plane is less than a threshold angle. The threshold angle may be between $10^{-4}$ radians and $10^{-8}$ radians. The substrate plane is a best fit plane to the substrate surface 130. The template plane is a best fit plane to the shaping surface 112. As illustrated in FIG. 5C the gap is reduced until there is a small residual layer thickness (RLT) of formable material that is a minimum thickness of formable material 124 between the substrate surface 130 and the shaping surface 112 in each imprint field. The RLT may between 3 nm to 500 nm. As the gap is reduced and the template 108 comes into contact with the formable material 124, the force supplied by the actuators is adjusted until a constant force (possibly zero) is exerted by the template 108 on the formable material 124 prior to the start of the curing step S308 and a specific dose of actinic radiation with a specific intensity is supplied to the formable material as illustrated by FIG. 5A. During the curing period $T_c$ the force and the gap may be held constant. The shaping process 300 may take milliseconds to seconds. At the end of the curing period, the actuators supply a force that allows the template 108 to be separated from the imprinted film on the substrate 102.

In an alternative embodiment, the force is not held constant during the curing period $T_c$ and instead follows a specified trajectory. In an embodiment, the force supplied by the actuators, is controlled via a feedback and/or feedforward system which may use detected positions, and/or detected forces in the feedback loop. The applicant has found that that amount of force and the trajectory of the force used during the shaping process 300 can impact the quality of the imprinted film. In particular the applicant has found that the value and/or trajectory of the force during the curing period has a large impact on the quality of the imprinted film. The applicant has found that prior to imprinting one or more fields on a substrate with a template it is useful to obtain a calibration measurement parameter that may be used to offset the value of the force applied by the template.

Figure 6A:
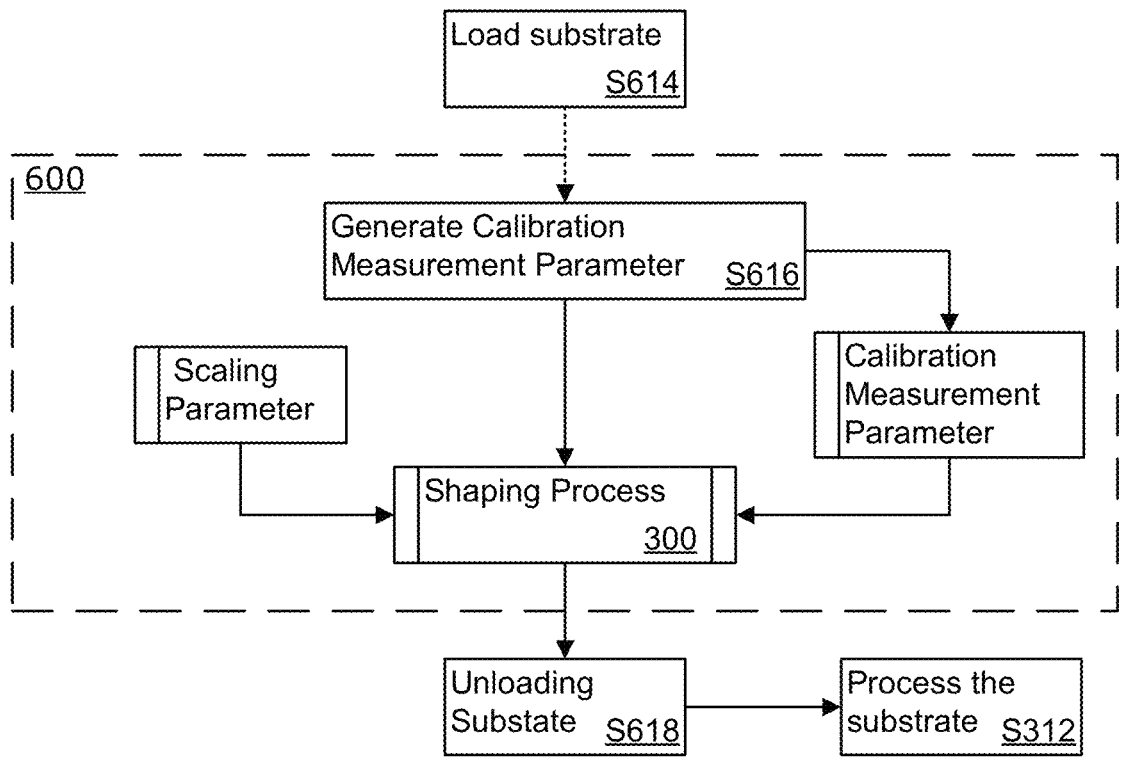
FIG. 6A is a flowchart illustrating a method that includes the generation of a calibration measurement parameter in an exemplary embodiment.

The calibration measurement parameter may represent environmental, and/or residual forces which prevent the one or more actuators from supplying the exact same force under the exact same conditions. The applicant has found that this calibration measurement parameter may drift in between substrates. The applicant has also found that calibration measurement parameter may not provide the accuracy that the applicant desires to effectively reflect disturbances to the shaping process. FIG. 6A is a flowchart illustrating a scaled shaping method 600 that includes the generation of a calibration measurement parameter. As illustrated in FIG. 6A, prior to the beginning of the scaled shaping process 600, in a loading step S614, a substrate 102 is loaded onto the substrate chuck 104. One or more calibration measurement parameters may be generated in a calibration measurement parameter generation step S616. The calibration parameter generation step S616 is performed prior to the shaping process 300 and before, after, or during the loading step S614. After the calibration measurement parameter generation step S616, the shaping process 300 is performed using the calibration measurement parameter and a scaling parameter. After the shaping process 300 is performed the substrate 102 is unloaded from the substrate chuck 104 in an unloading step S614 after which the processing step S312 is performed.

Figure 6B:
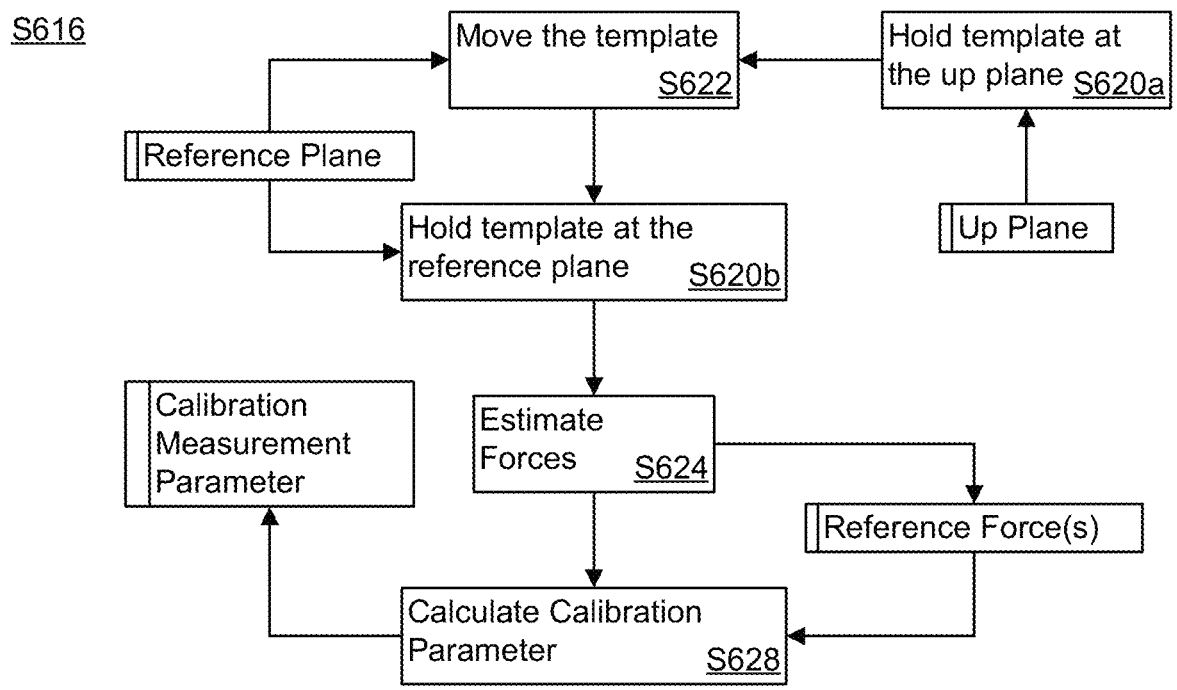
FIG. 6B is a flowchart illustrating a method of generating a calibration measurement parameter in an exemplary embodiment.

FIG. 6B is an illustration of one method of performing the calibration measurement parameter generation step S616 so as to obtain the calibration measurement parameter. The calibration measurement parameter generation step S616 may include an up plane holding step S620*a* in which the shaping surface 112 is held at an up plane that is a first distance above the substrate surface 130. In which the first distance 0.25, 0.5, 1, 2, 5, or 10 mm. The holding steps S620*a* and S620*b* may include the processor 140 sending positioning instructions to a position controller. The position controller may be: a subroutine implemented by the processor 140; one or more ASICs; one or more FPGAs; one or more DSPs; and/or one or more purpose built devices for implementing position control. The position controller may be implemented as feedback and/or feedforward position control. The positioning instructions may take the form of a digital signal, and/or an analog signal. The position controller may receive information from one or more encoders. The encoders may be: linear encoders; displacement sensors; capacitive linear encoders; interferometers; optical linear encoders; hall effect encoders; magnetoresistive encoders; inductive encoders; and/or eddy current encoders.

The calibration measurement parameter generation step S616 may include a moving step S622 in which the shaping surface 112 is moved from the up plane to a reference plane using the position controller described above. In an alternative embodiment, the reference plane could be the up plane.

The calibration measurement parameter generation step S616 may include a reference plane holding step S620*b* in which the template is held at the reference plane using one or more actuators. In an exemplary embodiment, the template is held at the reference plane close to shaping plane, which is within 1000, 500, 200, 100, 50, or 10 μm of the substrate surface 130. The shaping plane is a plane the shaping surface 112 is located at during the curing step S308. In a case in which the calibration parameter generation step S616 is performed prior to the loading step S614 the reference plane may be at, above, or below where the substrate surface 130 would be if the substrate 102 were loaded onto the substrate chuck 104.

The calibration measurement parameter generation step S616 may include a force estimation step S624 in which the holding force required to hold the template at the reference plane is estimated. The processor 140 may estimate the holding force by sending a request to the position controller to provide information that represents the amount of force that the one or more actuators supply while holding the template at the reference plane for a duration of a reference time or longer. The amount of force may be proportional to a control signal supplied to each of the one or more actuators at: a reference time after the position control started, or at a reference time after the one or more encoders indicate that the template has been within a reference threshold of the reference plane for a reference time. For example, the reference time may be 0.01, 0.05, 0.1, 1, 3, 15, or 30 seconds after the template is within 0.1% of the reference plane or within 0.001, 0.005, 0.01, 0.05, 0.1, 0.2, 0.3, 0.5, 1, or 2 μm of the reference plane. In an embodiment, the relationship between the amount of the force and the control signal may be based on a calibration table that varies with the position of the template 108 relative to a neutral plane. The neutral plane is the location of the shaping surface when no force is applied by the one or more actuators of the imprint head and the weight of the moving portion of the imprint head 120 is balanced by spring forces of stiffness elements which takes into account for example: springs, flexures, dampers, and/or other the components of the imprint head 120. The control signal may be a voltage, a current, or a digital value that is supplied to each actuator. In an embodiment, the amount of force may be proportional to a weighted sum of a signals produced by the one or more actuators. The signal produced by each of the actuators may indicate the amount of force and/or effort that each actuator attempted to supply. FIG. 6C is plot of a weighted sum of the control signals used to estimate the calibration measurement parameter.

The calibration measurement parameter generation step S616 may include a calibration measurement parameter calculation step S626 in which the calibration measurement parameter is calculated based on the reference force(s) generated in the force estimation step S624. The calibration measurement parameter calculation step S626 may include calculating a sum of the reference forces. In an alternative embodiment, the sum of the reference forces is a weighted sum of the reference forces. The weighting of the sum may be determined based on the positions of the one or more actuators, the positions of the one or more encoders, and a position of the center of the template.

The applicant has found that when the calibration measurement parameter is used to form device yielding films, the quality of the devices produced by the device yielding film may be improved. The calibration measurement parameter can be thought of as the 'zero error' of the force measurement scale. The calibration measurement parameter may be an aggregate measure of a plurality of different drifts/disturbances including the flow of air around the imprint head 120 at the time of the force estimation step S624 and stress relaxation of cables and tubing attached to the imprint head 120 and the finger assembly 121. The calibration measurement parameter is used to adjust the force and/or force trajectory during the shaping process by shifting the amount of force used by the calibration measurement parameter. The applicant has found that the quality can be further improved if the force and/or force trajectory that is shifted by a product of a scaling parameter and the calibration measurement parameter. The applicant has determined a method of generating a scaling parameter for the calibration measurement parameter which improves the quality of the device yielding film for a given set of imprint conditions. The calibration measurement parameter may not capture the true cable stress relaxation disturbance estimate at during the curing step S308. The applicant has found that the calibration parameter generation step S616 only improves the performance so much depending upon the magnitudes of different disturbances to the imprint head 120. The scaling parameter enables the applicant to scale the calibration measurement parameter by a gain which is based on the overlay data (which is our final objective of the shaping process 300). The applicant has found that the scaling factor can be an empirical estimate of how the calibration measurement parameter can be adjusted to provide a better estimate of the disturbances (for example cable stress relaxation) during the curing step S308.

One method of characterizing the quality of film formed with the shaping process 300 is by performing overlay distortion measurements. The applicant has found that it is possible to estimate the FIF used during the shaping process 300 based on the overlay distortion measurements. The applicant has found that the quality of the formed film can be improved if the FIF is precisely controlled during the shaping process 300. The FIF may be estimated by calibrating out the non-contact force (a calibration measurement parameter) at a reference plane and then determining the FIF through the commanded currents running through the actuators 420a. The applicant has observed that that there can be issues with this method of calibration of non-contact force due to disturbances such as the different stress relaxations (associated with cabling, tubing, etc.) during calibration measurement parameter generation step S616 and different stress relaxation magnitudes during the shaping process 300 over multiple fields on a substrate 102. This difference may arise because the cable relaxation dynamics may not have stabilized or are not in a steady state when starting from a rest state. The time difference between the generation of the calibration measurement parameter and the shaping process 300; and hysteresis effect of stress relaxation (different time histories before the generation of the calibration measurement parameter vs. the shaping process 300) may lead to an estimation of total disturbance by the calibration measurement parameter generation step S616 whose accuracy is less than the accuracy desired by the applicant. The applicant has found that controlling the precision at which the force applied during the curing step S308 improves overlay performance of the shaping process 300. For example, for overlay specification that are below 10 nm, the precision of the forces supplied during the shaping process needs to be less than: 0.5 Newtons; 0.1 Newtons; 0.05 Newtons; 0.03 Newtons; 0.01 Newtons; 0.005 Newtons; or 0.001 Newtons.

A desired FIF is one of set of shaping conditions that is important for the quality of the film formed by the shaping process 300. The actual FIF may be defined as a contact force applied by the shaping surface 112 to the formable material during a curing period $T_c$ or at the end of the curing step S308 which includes forces supplied by the one or more actuators 420a and any disturbance forces. The actual FIF is a critical parameter that needs to be controlled to minimize overlay distortions in the shaping process 300. The FIF may be controlled by controlling the current flowing through, for example voice coil type actuators 420a, when the template 108 comes in contact with the formable material. The applicant has found that using force sensors with sufficient accuracy to measure this FIF can impact the performance of the shaping process 300.

In an embodiment, the shaping process may include determining a calibration measurement parameter after a substrate 102 is loaded onto the substrate chuck 104 and prior to forming films on the substrate 102. The applicant has found that the forces experienced by the template 108 prior to contact with the formable material 124 at locations in the motion range can be broken down into two parts. A first part that has repeatable and well characterized forces such as spring and flexure related forces. A second part are disturbances which may include the strain development in the cables and tubes connected to the imprint head (depending upon the initial strain, displacement amplitudes and speeds, any non-linear effects such as friction between cables, motion profile history) that are difficult to predict in anything but a statistical manner.

Scaling Parameter Generation

Figure 7A:
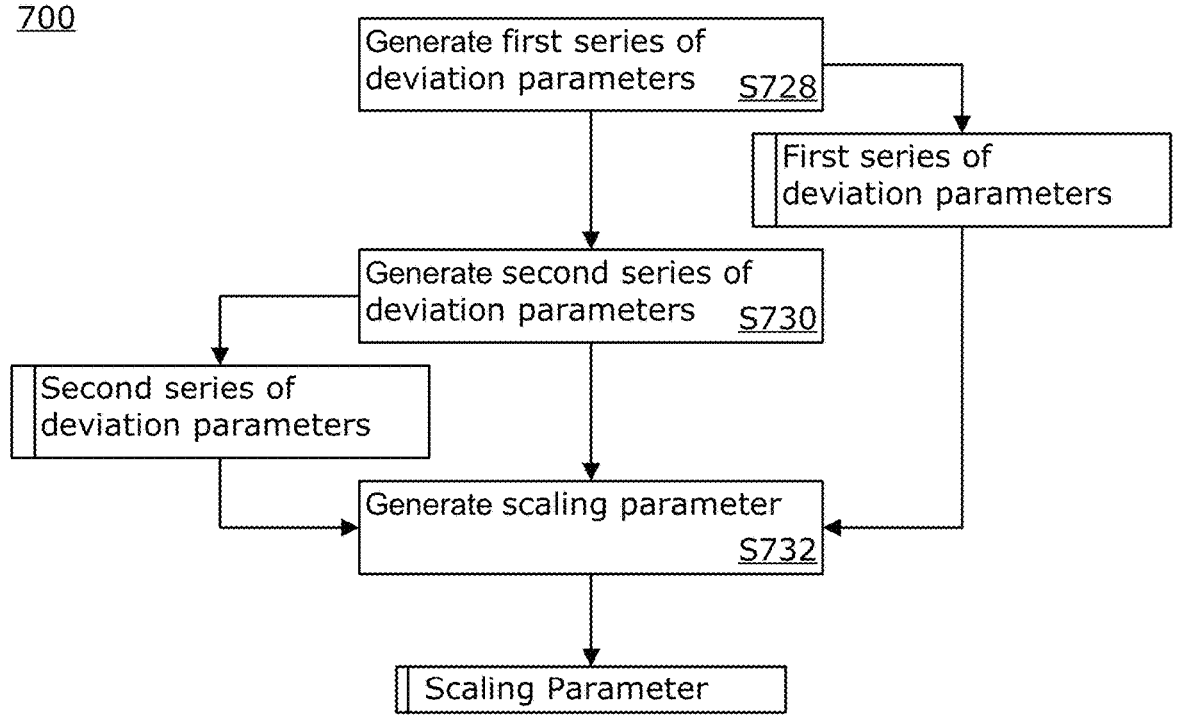
FIG. 7A is a flowchart of a scaling parameter generation method as may be used in an exemplary embodiment.

FIG. 7A is an illustration of a scaling parameter generation method 700 as may be used in an exemplary embodiment. The scaling parameter generation method 700 may include a generation of a first series of deviation parameters step S728 in which the first series of deviation parameters are generated. The generation of a first series of deviation parameters step S728 may include performing deviation tests on a first series of test films. The first series of test films may be produced on a first series of test substrates using the shaping system with: a set of shaping conditions; a calibration measurement parameter; and a first test scaling parameter. The calibration measurement parameter of the shaping system is determined for each test substrate prior to shaping that test film on the substrate with shaping system.

The scaling parameter generation method 700 may include a generation of a second series of deviation parameters step S730 in which the second series of deviation parameters are generated. The generation of the second series of deviation parameters step S730 may include performing deviation tests on a second series of test films. In a first alternative embodiment, the second series of test films may be produced on a second series of test substrates using the shaping system with a set of shaping conditions without the calibration measurement parameter. In a second alternative embodiment, the second series of test films may be produced on a second series of test substrates using the shaping system with a set of shaping conditions, the calibration measurement parameter, and a second test scaling parameter. In the second alternative embodiment, the calibration measurement parameter of the shaping system may be determined for each test substrate prior to shaping that test film with shaping system. In the first alternative embodiment, the calibration measurement parameter of the shaping may be determined but not used when shaping that test film with the shaping system, for example by using a zero as the second test scaling parameter.

The scaling parameter generation method 700 may include a generation of a scaling parameter step S732 in which the scaling parameter is generated based on the first series of the deviation parameters and the second series of deviation parameters.

Generation of the First series of Deviation Parameters

Figure 7B:
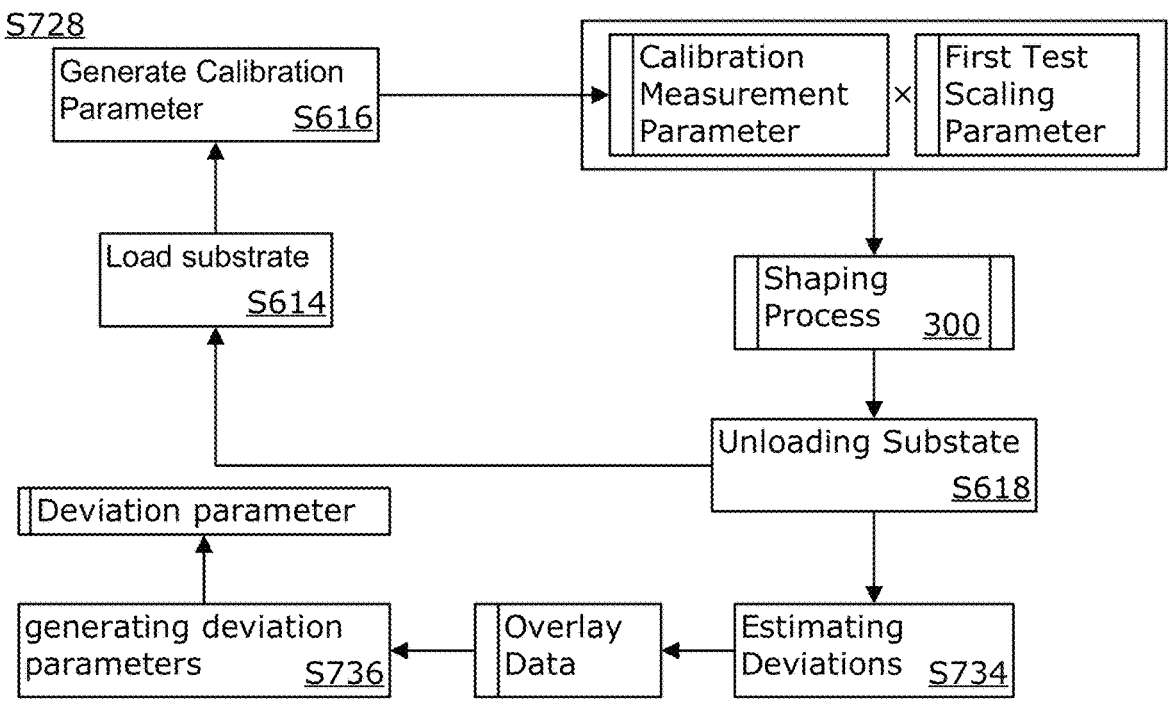
FIG. 7B is a flowchart of an exemplary method of performing the generation of the first series of deviation parameters step.

FIG. 7B is an illustration of an exemplary method of performing the generation of the first series of deviation parameters step S728. The generation of the first series of deviation parameters step S728 may include the loading step S614 in which a particular test substrate in the first series of test substrates is loaded onto the substrate chuck. The generation of the first series of deviation parameters step S728 may include the calibration measurement parameter generation step S616 performed with the particular substrate loaded onto the substrate chuck. The generation of the first series of deviation parameters step S728 may include performing the shaping process 300 using the calibration measurement parameter and a first test scaling parameter to form a particular test film on the particular test substrate. In an embodiment, the calibration measurement parameter is multiplied by the first test scaling parameter and that result is used by the shaping process 300. After the shaping process 300 is performed the substrate 102 is unloaded from the substrate chuck 104 in an unloading step S614. After the unloading step S614 the generation of the first series of deviation parameters step S728 returns to step S614 and the process repeat until all the test substrate in the in the first series of test substrates have been processed.

In an alternative embodiment, the shaping process 300 as applied to different substrates in each of the series of substrates using a different method of performing the calibration measurement parameter generation step S616. For example, different substrates in the first series of test substrates, the second series of test substrates, and a series of device yielding substrates may use different methods of performing the calibration measurement parameter generation step S616. For example, a first substrate in the first series of test substrates, the second series of test substrates, and a series of device yielding substrates may use a first reference plane and a first reference time and while second and subsequent substrates in the first series of test substrates, the second series of test substrate, and the series of device yielding substrates may use a second reference plane and a second reference time. Another example would be that the first and second substrates in the first series of test substrates, the second series of test substrates, and the series of device yielding substrates use a first reference plane and a first reference time for calibration measurement parameter generation step S616, while the third substrate and subsequent substrate use a different second reference plane and a second reference time are used for calibration measurement parameter generation. In an embodiment, the performance of the calibration measurement parameter generation step S616 may vary across substrates, as long as the variation is consistent across the first series of test substrates, the second series of test substrates, and the device yielding film. In an embodiment, the calibration measurement parameter generation step S616 is not performed when forming test films for the second series of test substrates, in which case the measurement parameter generation step S616 the may vary across substrates, as long as the variation is consistent across the first series of test substrates and the device yielding film.

The generation of the first series of deviation parameters step S728 may include an estimating deviations step S734. The estimating deviations step S734 may include estimating deviations of the particular test film from an ideal film. The estimating deviations step S734 may include generating overlay data for the each of the test films in the series of test films.

The generation of the first series of deviation parameters step S728 may include a generation of deviation parameters step S736 of generating a particular deviation parameter in the first series of deviation parameters based on the deviations of the particular test film. The particular deviation parameter is generated for each test film in the set of test films to form a first series of the deviation parameters.

Generation of the Second Series of Deviation Parameters

Figure 7C:
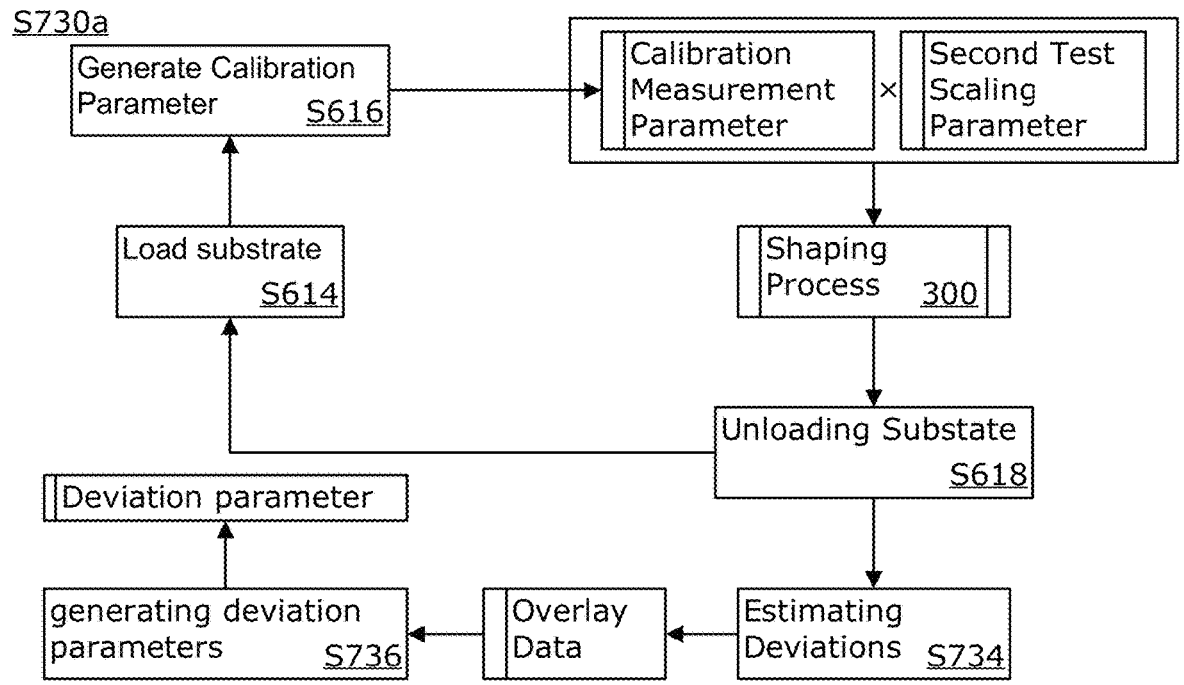
FIGS. 7C-D are flowcharts of exemplary methods of performing the generation of the second series of deviation parameters as may be used in an exemplary embodiment.

FIG. 7C is an illustration of a first exemplary method of performing the generation of the second series of deviation parameters step S730a. The generation of the second series of deviation parameters step S730a may include the loading step S614 in which a particular test substrate in the second series of test substrates is loaded onto the substrate chuck. The generation of the second series of deviation parameters step S730a may include the calibration measurement parameter generation step S616 performed with the particular substrate loaded onto the substrate chuck. The generation of the second series of deviation parameters step S730a may include performing the shaping process 300 using the calibration measurement parameter and a second test scaling parameter to form a particular test film on the particular test substrate. After the shaping process 300 is performed the substrate 102 is unloaded from the substrate chuck 104 in an unloading step S614. After the unloading step S614 the generation of the second series of deviation parameters step S730a returns to step S614 and the process repeat until all the test substrate in the in the second series of test substrates have been processed. In an embodiment, if the particulars of a routine for performing the calibration parameter measurement generation step S616 are different for different substrates in the generation of first series of deviation parameters S728, same sequence and particulars of the routine for performing calibration parameter measurement generation step S616 should be followed for the generation of the second series of deviation parameters step S730. The same sequence and particulars of the routine for performing the calibration parameter measurement generation step S616 should be followed for the scaled shaping process 600.

The generation of the second series of deviation parameters step S730a may include an estimating deviations step S734. The estimating deviations step S734 may include estimating deviations of the particular test film from an ideal film. The estimating deviations step S734 may include generating overlay data for the each of the test films in the series of test films.

The generation of the second series of deviation parameters step S730a may include a generation of deviation parameters step S736 of generating a particular deviation parameter in the second series of deviation parameters based on the deviations of the particular test film. The particular deviation parameter is generated for each test film in the set of test films to form a second series of the deviation parameters.

Figure 7D:
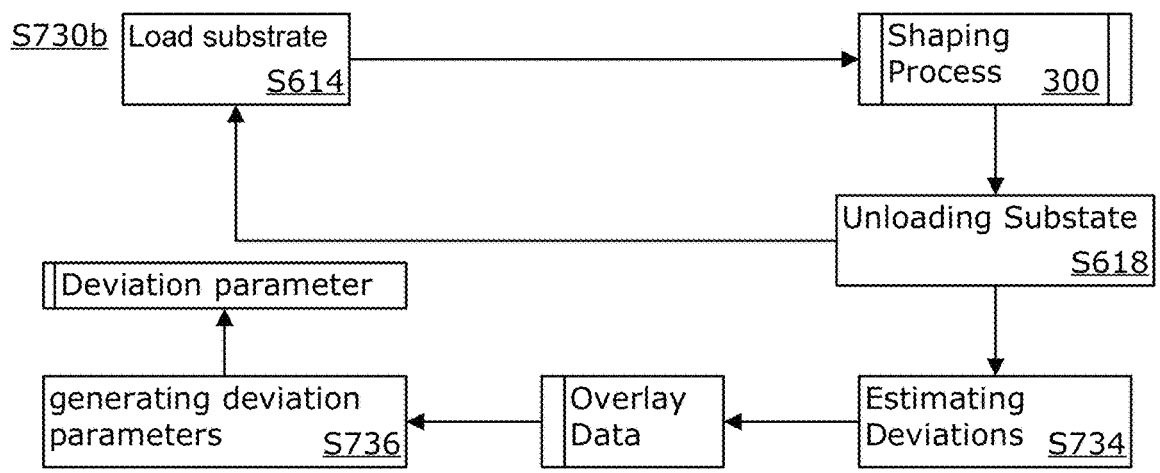

FIG. 7D is an illustration of a second exemplary method of performing the generation of the second series of deviation parameters step S730b. The second exemplary method of performing the generation of the second series of deviation parameters step S730b is substantially similar to first exemplary method of performing the generation of the second series of deviation parameters step S730a except that the shaping process 300 is done without the use of the calibration measurement parameter and the calibration measurement parameter generation step S616 may be skipped. In an alternative embodiment, the calibration measurement parameter generation step S616 is performed and the information is not used in the shaping process 300.

Forming the Test Film

The method of forming the test film is identical to the shaping process 300 except that the process parameters are different. The test film is in the first series of test films and the second series of test films. The method of forming the test film may include depositing formable material on an imprint field of the test substrate. The method of forming the test film may include depositing formable material across the entire the test substrate. The method of forming the test film may include contacting the formable material on the imprint field with the template. The method of forming the test film may include contacting the formable material on the test substrate with the template that has a shaping surface that covers the entire substrate. The method of forming the test film may include irradiating the formable material with actinic radiation while the template is held in contact with the formable material. The method of forming the test film is performed with a set of shaping conditions. The set of shaping conditions may include a desired amount of force to be supplied by one or more actuators to the template while the formable material is irradiated with actinic radiation. The method of forming the test film may include the processor 130 and/or a device connected to the processor 130 sending control information to one or more actuators to instruct them to supply the desired amount of force. The desired amount of force may be adjusted based on calibration measurement parameter and a first test scaling parameter. The desired amount of force may be adjusted based on calibration measurement parameter and a second scaling parameter. In an embodiment, the test film used for generating the second set of deviation parameters is not adjusted based on the calibration measurement parameter.

In an embodiment, the test substrate may include a plurality of imprint fields. In an embodiment, in the shaping process 300 the desired amount of force, that is used during the curing step S308 is different for each imprint field. In an embodiment, in the shaping process 300 the desired force trajectory, that is used during the curing step S308 is different for each imprint field.

Estimating Deviations

Figure 8A:
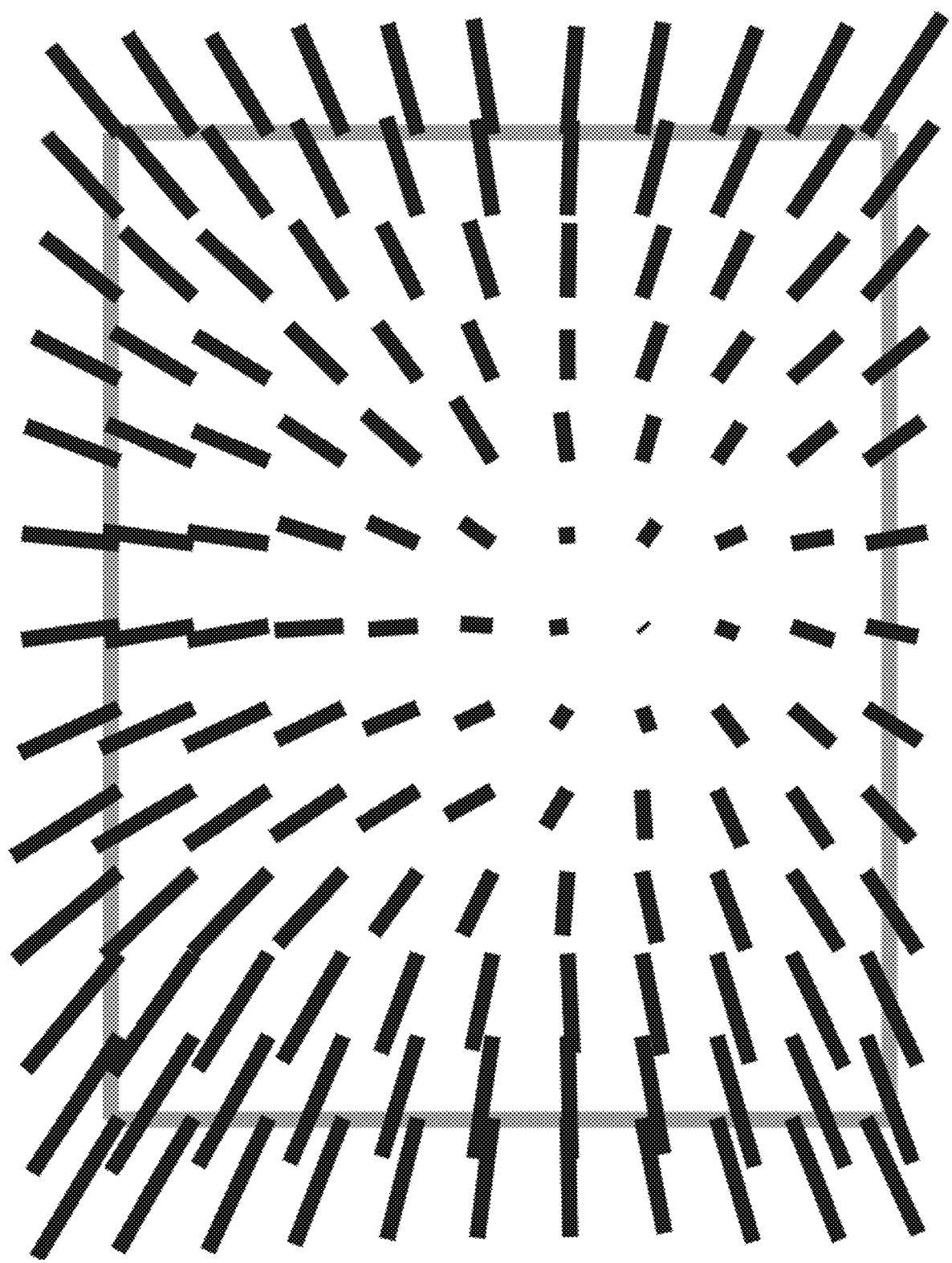
FIGS. 8A-B are vector plots representing sets of differences of positions of features on test films as may be used in an exemplary embodiment.
Figure 8B:
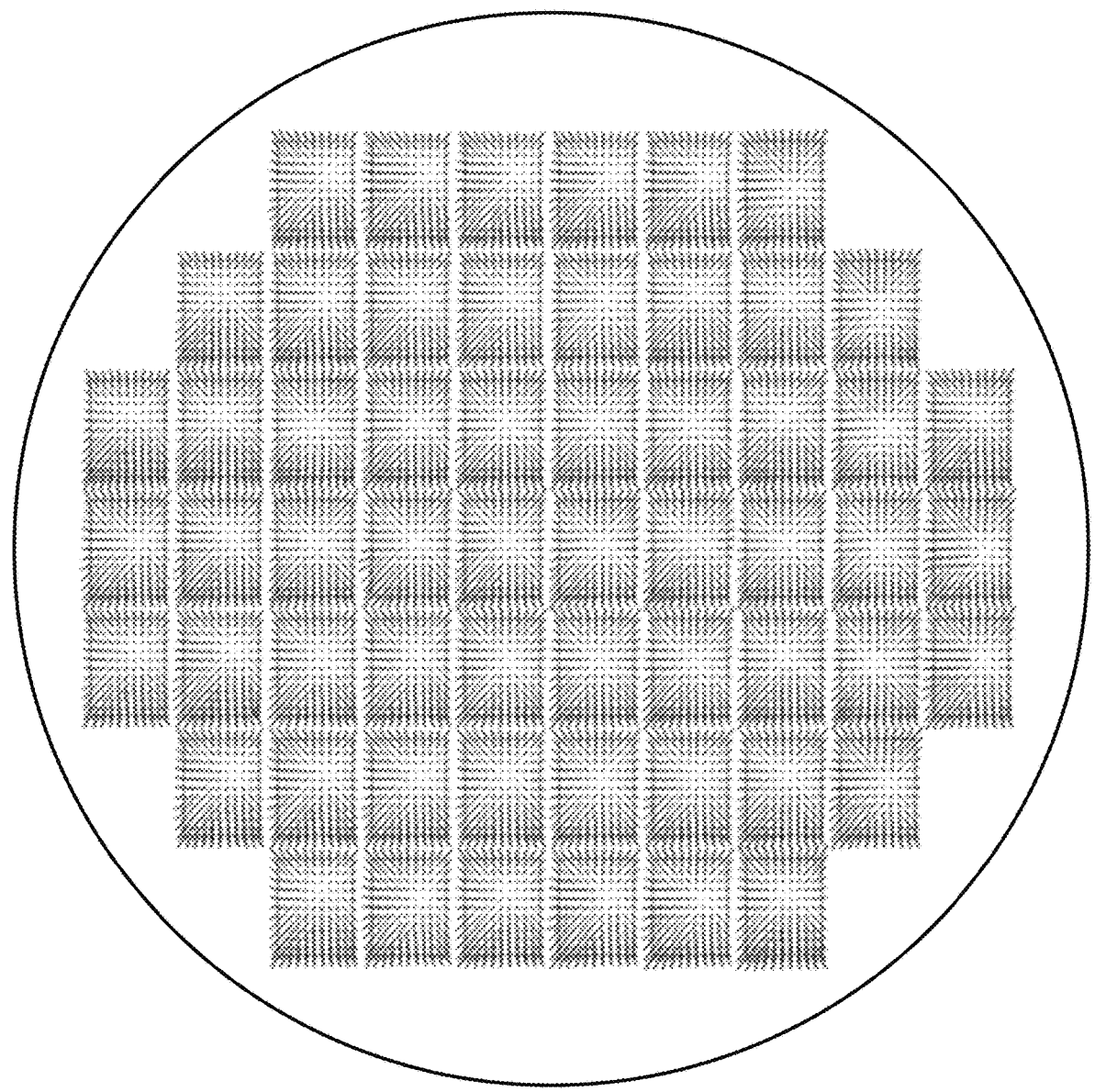

An exemplary embodiment, may include generating deviation parameters from deviation tests. In an embodiment, the deviation test may be performed by inspecting a particular test substrate to determine a set of differences between a first plurality of test features in a particular test film relative to a second plurality of test features in an underlying layer underneath the test film. Wherein each of the test features in the first plurality of test features and the second plurality of test features are diffraction gratings. Wherein in the set of differences are obtained by shining light onto the test features measuring the moiré fringes produced by the overlying diffraction gratings of the test features. In an embodiment, the deviation test may be performed by inspecting a particular test film in the first or second series of test films to determine a set of measured positions of a plurality of test features. In an embodiment, the set of measured positions may then be used to determine a set of differences between the set of measured positions and a set of expected positions of the ideal film. In an embodiment, the set of measured positions may then be used to determine a set of differences between a first set of measured positions of the particular test film and a second set of measured positions on the particular test substrate underneath the test film. FIG. 8A is an illustration of a vector plot illustrating a set of differences in an exemplary embodiment of a particular test film on a test substrate (on a nanometer scale). The vector plot illustrates the relative scale and direction of the set of differences. FIG. 8B is an illustration of a vector plot illustrating a plurality of sets of differences in an exemplary embodiment of a plurality of test films on a test substrate (on a nanometer scale).

The inspection of test film and the determination of the set of differences may be produced using overlay inspection tools such as the Archer™ 700 by KLA-Tencor, optical inspection tools, optical scanning tools, ion beam inspection tools, or scanning electron microscope based inspection tools.

Generating Deviation Parameters

An exemplary embodiment, may include a method of generating a particular deviation parameter in the first or second series of deviation parameters. Each particular deviation parameter is associated with a particular test film and is based on a set of differences which have been determined for the particular test film. Generating each particular deviation parameter may include fitting the set of differences for each particular test film to a process variation model. The process variation model determines an estimated set of shaping conditions that were used to shape the particular test film. The particular deviation parameter may be an estimate of one particular shaping condition in the set of shaping conditions.

In an embodiment, the deviation parameter is an estimation of contact force exerted by the template 108 on the formable material 124 on the test substrate 102 while the formable material 124 is being exposed to actinic radiation from the radiation source 126.

The process variation model may be based on one or more of experimental methods and simulation methods, such as finite element analysis, finite difference analysis, finite volume analysis, and other computational methods which describe how variation in the set of shaping conditions results in variation in quality of the imprinted film. US patent publication No. 2019/0033709-A1, which is hereby incorporated by reference, describes how this variation in the set of shaping conditions can results in variation in the quality of the imprinted film and how this variation can be simulated. The set of shaping conditions which can be simulated by the process variation model includes the force used during a curing period $T_c$ along with other shaping conditions. A first set of these other shaping conditions may be controlled with the positioning systems such as: shift(s) along one or more perpendicular axes; rotation along one or more axes; tilt along one or more axes; and rotation along one or more axes. A second set of these shaping conditions may be associated with the thermal radiation source 134 and/or the finger sub-assembly 121 such as: magnification along one or more axes; trapezoidal distortion along one or more axes; and skew along one or more axes.

Figure 9A:
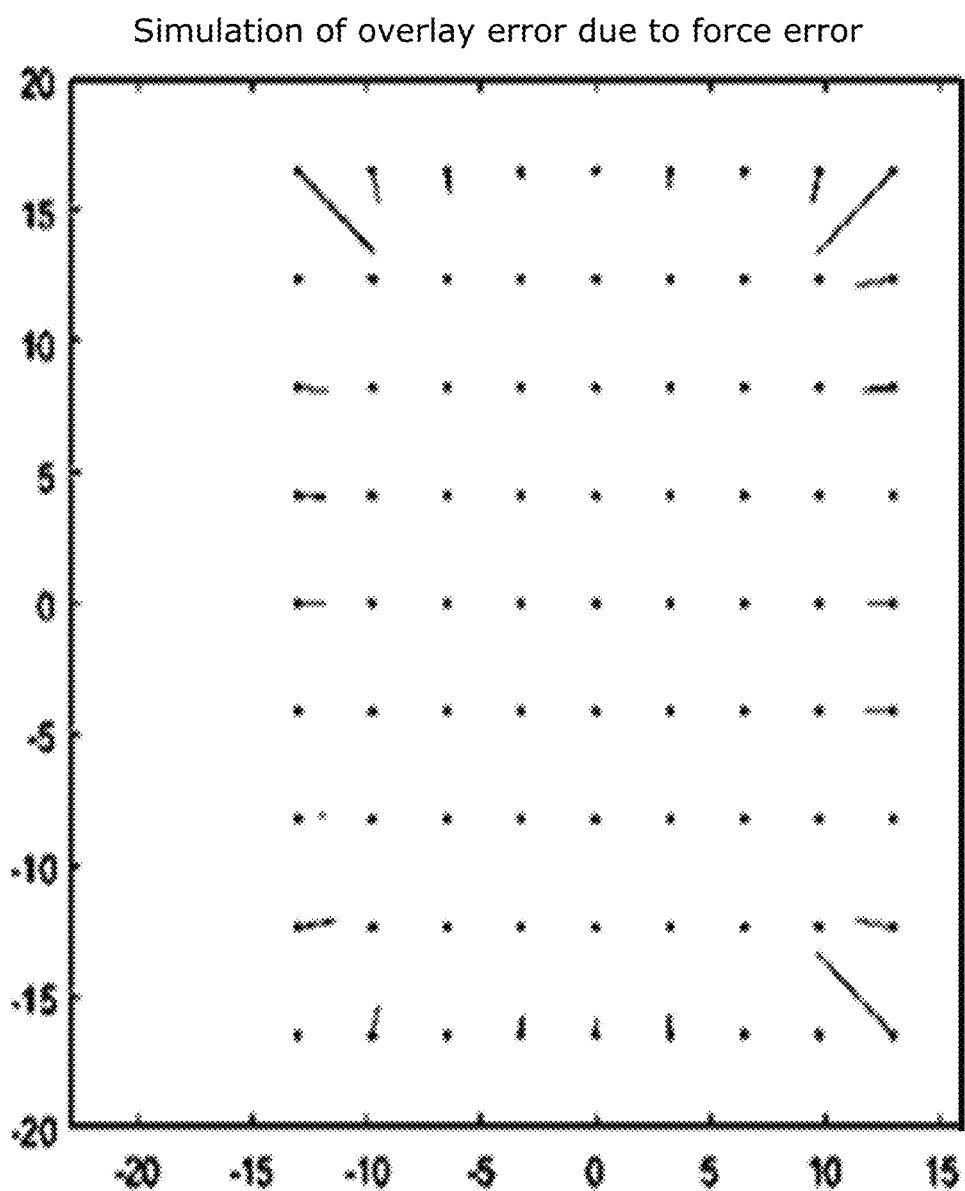
FIGS. 9A-B are simulated vector plots representing predicted sets of differences of positions of features on test films that may be used in an exemplary embodiment.
Figure 9B:
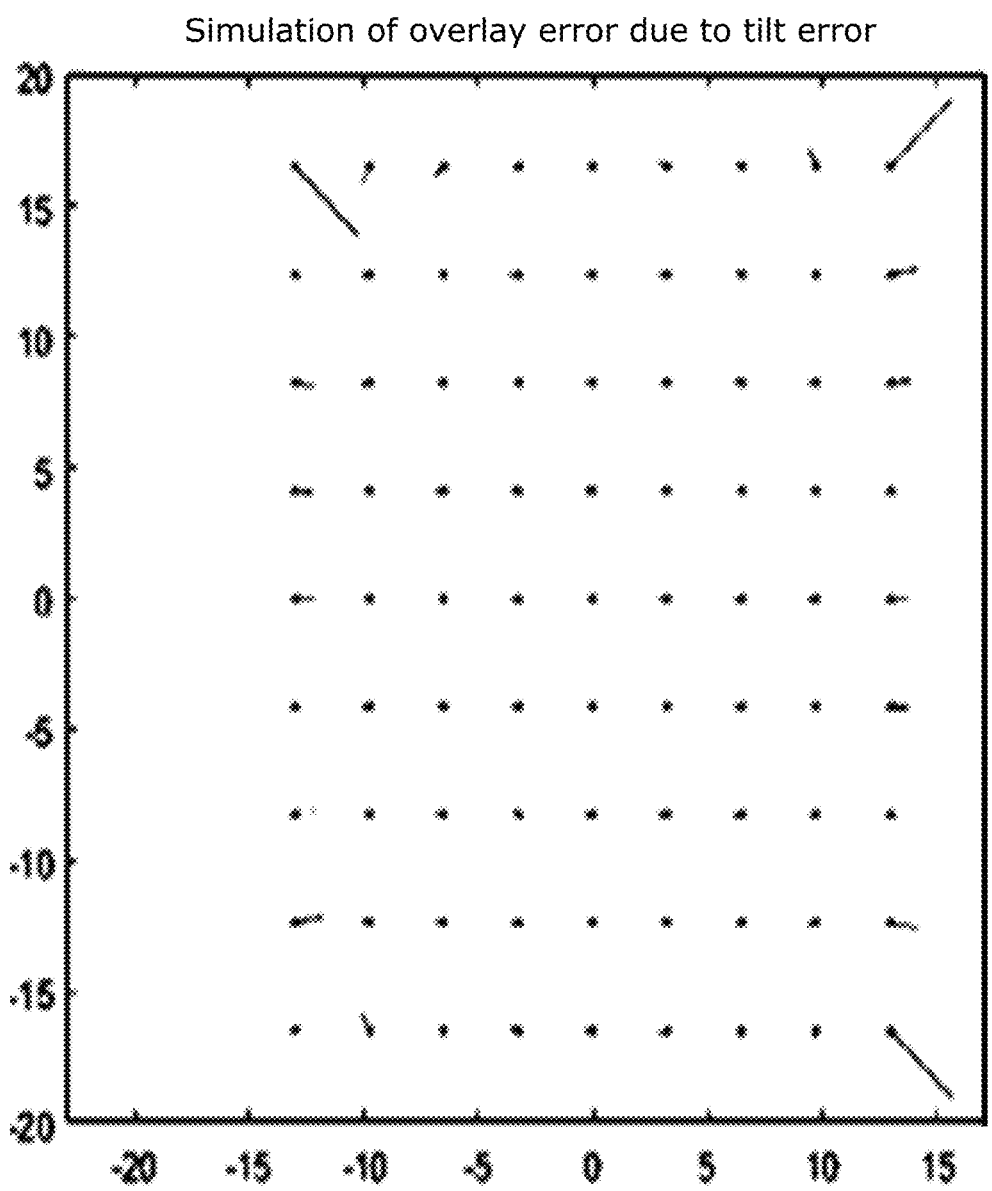
Figure 9C:
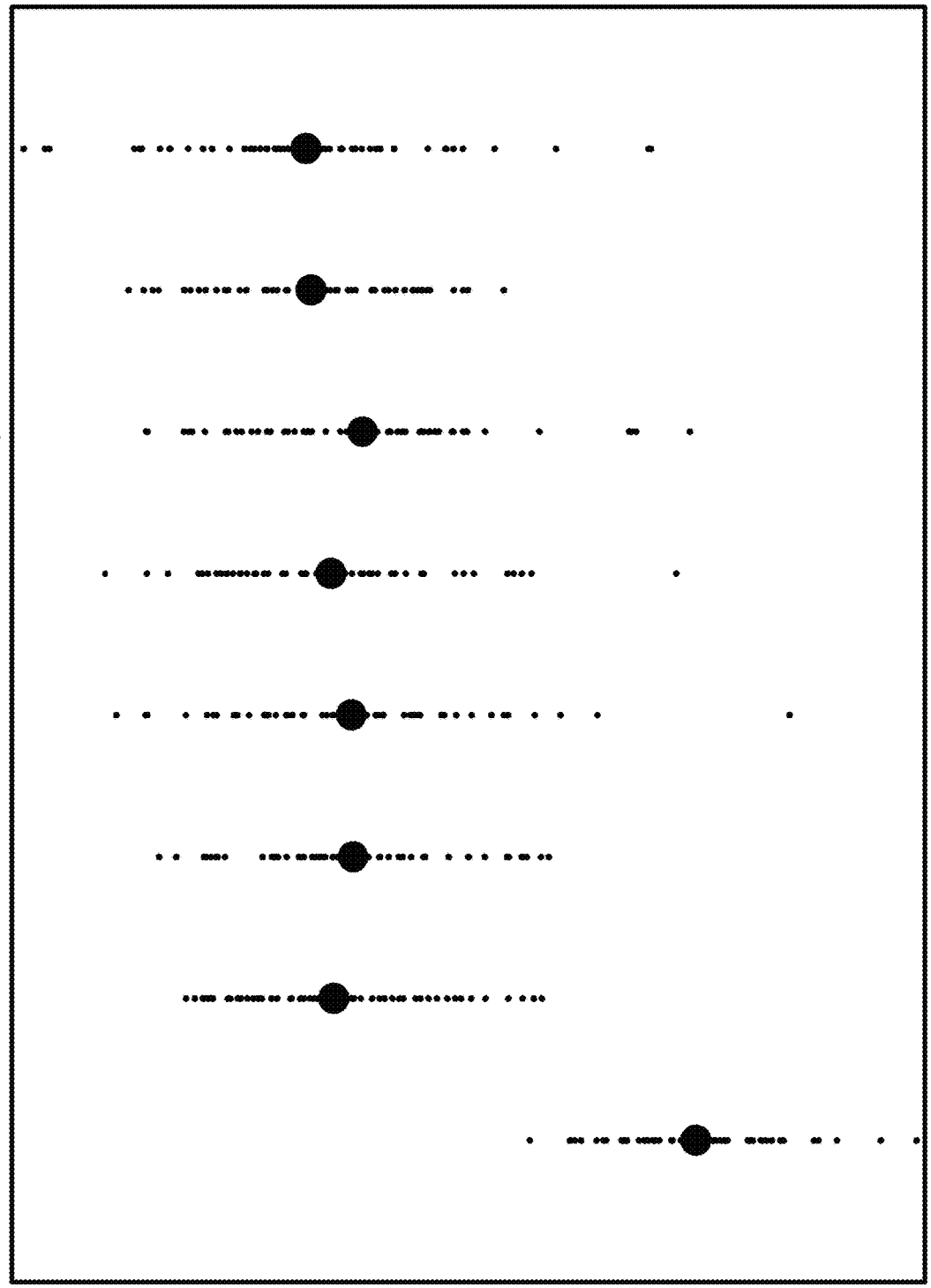
FIG. 9C is a chart illustrating estimations of the final imprint force in a plurality of fields and substrates based on overlay data as may be generated in an exemplary embodiment.

FIG. 9A is an illustration of simulation results produced by process variation model of overlay data of an ideal test film imprinted with a set of shaping conditions in which the force supplied during the shaping process 300 has deviated from the ideal force in the set of shaping conditions. FIG. 9B is an illustration of simulation results by the process variation model of overlay data of an ideal test film imprinted with a set of shaping conditions in which the shaping surface 112 is tilted along one axis relative to the substrate surface 130 during the shaping process 300 has deviated from the ideal tilt in the set of shaping conditions. FIG. 9C is chart showing deviation parameters (small dashes) measured across multiple test films on multiple imprint fields over a plurality of test substrates and deviation parameters averaged over each test substrate (large dot).

Generating Scaling Parameters

In an embodiment, generating the scaling parameter may include determining a value of the scaling parameter (S) that minimizes a first function (F). The first function (F) may be based on the first series of the deviation parameters ($D_{1,i,j}$) and the second series of deviation parameters ($D_{2,i,j}$) as described by equation (1) below.

$$\min_S (F(D_{1,i,j}, D_{2,i,j}, S)) \quad (1)$$

The first function (F) is a statistical quantity that represents a variation of a second function (G) over the first series of the deviation parameters ($D_{1,i,j}$) with the first test scaling parameter ($s_1$) and the second series of deviation parameters ($D_{2,i,j}$) with the second test scaling parameter ($s_2$) being typically smaller than $s_1$. In an embodiment, the test scaling parameters are between a minimum possible value for S ($S_{min}$) and a maximum possible value for S ($S_{max}$) and the scaling parameter is between $S_{min}$ and $S_{max}$ ($S_{max} \geq s_1 > s_2 \geq S_{min}$) In an embodiment, the minimum value for S ($S_{min}$) may be −1, 0, 0.01, or another value based on experiments. In an embodiment, the maximum value for S ($S_{max}$) may be 1, 1.2, 2, another value based on experiments. In an embodiment, $s_1$ is one and $s_2$ is zero. In an embodiment, the first scaling parameter, $s_1$, is one, and second scaling parameter, $s_2$, is greater than zero and less than one. Equation (2) below illustrates an example in which the statistical moment is the standard deviation. The substrate index (i) represents a temporal positional order of a particular test substrate in each of the first series of test substrates and the second series of test substrates. The number (N) is the quantity of test substrates in each of the first series of test substrates and the second series of test substrates. The field index (j) of an imprint field on each of the test substrates in each of the first series of test substrates and the second series of test substrates. In an embodiment, the scaling parameter (S) is determined so as to minimize the first function (F). The determination of S can be made using least squares solver/regression, optimization, constrained optimization, or another generic computational solver. Alternative definitions of the first function (F) are given by equation (3) or equation (4) below. The first function (F) may also be adjusted to calculate higher order (k) statistical moments of the second function as illustrated in equation (5) below.

$$F(D_{1,i,j}, D_{2,i,j}, S) = \quad (2)$$

$$\sqrt{\frac{1}{N-1}\sum_{i=1}^{N}\left(G_i(D_{1,i,j}, D_{2,i,j}, S) - \frac{1}{N}\sum_{i=1}^{N} G_i(D_{1,i,j}, D_{2,i,j}, S)\right)^2}$$

$$F(D_{1,i,j}, D_{2,i,j}, S) = \quad (3)$$

$$\sum_{i=1}^{N}\left(G_i(D_{1,i,j}, D_{2,i,j}, S) - \frac{1}{N}\sum_{i=1}^{N} G_i(D_{1,i,j}, D_{2,i,j}, S)\right)^2$$

$$F(D_{1,i,j}, D_{2,i,j}, S) = \quad (4)$$

$$\sum_{i=1}^{N}\left|G_i(D_{1,i,j}, D_{2,i,j}, S) - \frac{1}{N}\sum_{i=1}^{N} G_i(D_{1,i,j}, D_{2,i,j}, S)\right|$$

$$F = \sum_{i=1}^{N}\left(\frac{G_i - \frac{1}{N}\sum_{i=1}^{N} G_i}{\sqrt{\frac{1}{N-1}\sum_{i=1}^{N}\left(G_i - \frac{1}{N}\sum_{i=1}^{N} G_i\right)^2}}\right)^k \quad (5)$$

In an embodiment, equation (6) below is the second function. The constant M is number of imprint fields on each of the test substrates.

$$G_i = \frac{1}{M(s_1 - s_2)}\left(\sum_{j=1}^{M}(s_1 D_{2,i,j} - s_2 D_{1,i,j}) + S\left(\sum_{j=1}^{M} D_{1,i,j} - \sum_{j=1}^{M} D_{2,i,j}\right)\right) \quad (6)$$

In an embodiment, the scaling parameter (S) is calculated using equation (7).

$$S = \frac{1}{N-1}\sum_{i=2}^{N}\frac{s_2\sum_{j=1}^{M}(D_{1,i,j} - D_{1,1,j}) - s_1\sum_{j=1}^{M}(D_{2,i,j} - D_{2,1,j})}{\sum_{j=1}^{M}(D_{1,i,j} - D_{1,1,j}) - \sum_{j=1}^{M}(D_{2,i,j} - D_{2,1,j})} \quad (7)$$

In an embodiment, two or more scaling parameters ($S_k$) are determined for the test substrates. In this embodiment, the test films on the test substrates are formed using test scaling parameters $s_1$ and $s_2$ as explained above. Then, a set of multiple scaling parameters ($\mathbb{S} = \{S_1, S_2, \ldots\}$) are determined from the test substrate deviations. Each device substrate is assigned to a scaling parameter from this set $\mathbb{S}$, which will be used to form the device films. In an embodiment, the first device substrate uses a first scaling parameter $S_1$, the second to fourth device substrates use a second scaling parameter $S_2$, and the remaining device substrates use a third scaling parameter $S_3$. The set of scaling parameters minimizes a first function (F). In the first function F, instead of a single value for the scaling parameter S, the set of multiple scaling parameters is used (e.g. the set $\mathbb{S} = \{S_1, S_2, S_3\}$), wherein each substrate is assigned to a scaling parameter from the set as described above. The applicant has determined that in some embodiments, first function F has a lower minimum when two or more scaling parameters are used, therefore improving the quality of the device films.

In an embodiment, equations (1)-(5) above can be revised to replace S with $\mathbb{S}$ and equation (6) is redefined as equation (8) shown below. In which $n_1$ is 2 and $n_2$ is 5. The applicant has found that use of two or more different scaling parameters is useful when there is a jump between sets of substrates. The values of $n_1$ and $n_2$ may vary depending on the drift behavior of the shaping system.

$$G_i = \frac{1}{M(s_1 - s_2)}\left(\sum_{j=1}^{M}(s_1 D_{2,i,j} - s_2 D_{1,i,j}) + S_k\left(\sum_{j=1}^{M} D_{1,i,j} - \sum_{j=1}^{M} D_{2,i,j}\right)\right) \quad (8)$$

$$S_k = \begin{cases} S_1 & \text{for } 1 \leq i < n_1 \\ S_2 & \text{for } n_1 \leq i < n_2 \\ S_3 & \text{for } n_2 \leq i \leq N \end{cases}$$

In a first embodiment, the scaling parameter is calculated based on test films formed on both full imprint fields which do not intersect with a boundary of the substrate and partial imprint fields which do intersect with the boundary of the substrate such that the scaling parameter takes into account the effect of shaping test films on both partial fields and full imprint fields. In a second embodiment, the scaling parameter is calculated based on test films formed on full imprint fields only so as to better optimize the performance of shaping films on full imprint fields.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. A method of shaping a film with a template on a substrate with a shaping system comprising:
    generating a first series of deviation parameters from deviation tests performed on a first series of test films on a first series of test substrates produced using the shaping system with: a set of shaping conditions; a non-contact calibration measurement parameter of the shaping system determined for each test substrate prior to shaping; and a first test scaling parameter;
    wherein the shaping system includes a plurality of imprint force actuators which are configured to move the template held by a template chuck up and down and supply a specific calibrated force during a curing step;
    wherein the set of shaping conditions includes the specific calibrated force supplied by the plurality of imprint force actuators during the curing step;
    wherein the template is held at a shaping plane during the curing step by the plurality of imprint force actuators;
    measuring the non-contact calibration measurement parameter of the shaping system prior to shaping each of the first series of test films includes:
        holding the template at a non-contact reference plane above the substrate using the plurality of imprint force actuators;
        estimating non-contact reference forces that the plurality of imprint force actuators use to hold the template at the non-contact reference plane for a reference time; and
        calculating the non-contact calibration measurement parameter as a weighted sum of the non-contact reference forces;
    wherein the reference plane is different from the shaping plane;
    wherein forming the first series of test films includes sending control information to the imprint force actuators during the curing step based on:
        the specific calibrated force;
        the non-contact calibration measurement parameter for each of the first series of test substrates; and
        the first test scaling parameter;
    generating a second series of deviation parameters from the deviation tests performed on a second series of test films on a second series of test substrates produced using the shaping system with the set of shaping conditions;
    wherein the second series of test films are produced with the non-contact calibration measurement parameter determined for each test substrate; and a second test scaling parameter; or without the non-contact calibration measurement parameter;
    measuring the non-contact calibration measurement parameter of the shaping system prior to shaping the second series of test films includes:
        holding the template at the non-contact reference plane above the substrate using the plurality of imprint force actuators;
        estimating the non-contact reference forces that the plurality of imprint force actuators use to hold the template at the non-contact reference plane for the reference time; and
        calculating the non-contact calibration measurement parameter as the weighted sum of the non-contact reference forces;
    wherein forming the second series of test films includes sending control information to the imprint force actuators during the curing step, wherein the control information is one of:
        the specific calibrated force; and
        an adjusted specific calibrated force based on:
            the specific calibrated force;
            the non-contact calibration measurement parameter for each of the second series of test substrates; and
            the second test scaling parameter;
    generating a scaling parameter from: the first series of deviation parameters; and the second series of deviation parameters;
    forming the device yielding film using the set of shaping conditions, the non-contact calibration measurement parameter, and the scaling parameter.

2. The method of claim 1, wherein the estimation of each of the non-contact reference forces is based on a current supplied to each of the plurality of imprint force actuators.

3. The method of claim 1, wherein when the template is at the non-contact reference plane, a patterning surface of the template is positioned 50 µm above the shaping plane.

4. The method of claim 1, wherein the holding the template at the non-contact reference plane includes receiving position information from position encoders and sending control information to the plurality of imprint force actuators based on a feedback loop.

5. The method of claim 1, wherein the reference time is 1 second after the template is within 0.1% of the non-contact reference plane.

6. The method of claim 1, wherein the forming the test films on the first series of test substrates comprises:
    depositing formable material on an imprint field of the test substrates;
    contacting the formable material on the imprint field with the template during a contacting step; and
    irradiating the formable material with actinic radiation while the template is held in contact with the formable material during the curing step;
    wherein the set of shaping conditions includes the specific calibrated force to be supplied by the plurality of imprint force actuators to the template while the formable material is irradiated with actinic radiation during the curing step;
    wherein the control information which is sent to the plurality of imprint force actuators to instruct them to supply a desired amount of contact force is determined based on the specific calibrated force and the non-contact calibration measurement parameter.

7. The method of claim 6, wherein the test substrate includes a plurality of imprint fields; and
    wherein the specific calibrated force is different for each imprint field.

8. The method of claim 1, wherein the deviation tests, comprise:
    inspecting a particular test film in the first or second series of test films to determine a set of differences between positions of a first plurality of test features in the particular test film and a second set of test features in an underlying layer underneath the particular test film.

9. The method of claim 8, wherein generating a particular deviation parameter in the first or second series of deviation parameters, comprises:
    fitting the set of differences for each of the first or second series of test films to a process variation model;
    wherein the process variation model determines an estimated set of shaping conditions that were used to shape the particular test film; and
    wherein the particular deviation parameter is one of the estimated set of shaping conditions.

10. The method of claim 9, wherein the deviation parameter is an estimation of contact force that the plurality of imprint force actuators of the shaping system supply to the template that is in contact with the formable material on the test substrate while the formable material is being exposed to actinic radiation during the curing step.

11. The method of claim 1, wherein the first test scaling parameter is one, and second test scaling parameter is greater than zero and less than one.

12. The method of claim 1, wherein the generating the first series of deviation parameters comprises:
    (a) generating a particular non-contact calibration measurement parameter of the shaping system, prior to forming, with the template and the shaping system, a particular test film in the first series of test films on a particular substrate in the first series of test substrates;
    (b) forming, with the template and the shaping system, the particular test film on the particular test substrate using: the set of shaping conditions, the particular non-contact calibration measurement parameter, and the first test scaling parameter;
    (c) estimating deviations of the particular test film from an ideal film;
    (d) generating a particular deviation parameter in the first series of deviation parameters based on the deviations of the particular test film; and
    (e) forming the first series of deviation parameters by repeating steps (a)-(d) for each particular test substrate in the first series of substrates.

13. The method of claim 1, wherein the generating the second series of deviation parameters comprises:
    (a) forming, with the template and the shaping system, a particular test film in the second series of test films on a particular substrate in the second series of test substrates using the set of shaping conditions;
    (b) estimating deviations of the particular test film from an ideal film;
    (c) generating a particular deviation parameter in the second series of deviation parameters based on the deviations of the particular test film; and
    (d) forming the second series of the deviation parameters by repeating steps (a)-(c) for each particular test substrate in the second series of substrates.

14. A method of manufacturing articles including the method of shaping the film recited in claim 1, the method of manufacturing articles further comprising:
    processing the device yielding substrate on which the device yielding film is produced so as to manufacture the articles.

15. The method of claim 1, wherein the control information is the specific calibrated force.

16. The method of claim 1, wherein the control information is the adjusted specific calibrated force.

17. The method of claim 1, wherein measuring the non-contact calibration measurement parameter of the shaping system is performed prior to the shaping the first series of test films and after or during a loading step of loading each of the first series of test substrates.

* * * * *